United States Patent
You et al.

(10) Patent No.: US 11,740,706 B2
(45) Date of Patent: Aug. 29, 2023

(54) KEYBOARD TOUCH ELECTRODE MODULE AND TOUCH KEYBOARD THEREWITH

(71) Applicant: DARFON ELECTRONICS CORP., Taoyuan (TW)

(72) Inventors: Wei-Yan You, Taoyuan (TW); Chin-Lung Chan, Taoyuan (TW); Po-Yueh Chou, Taoyuan (TW)

(73) Assignee: DARFON ELECTRONICS CORP., Taoyuan (TW)

(*) Notice: Subject to any disclaimer, the term of this patent is extended or adjusted under 35 U.S.C. 154(b) by 156 days.

(21) Appl. No.: 17/316,737

(22) Filed: May 11, 2021

(65) Prior Publication Data

US 2021/0349547 A1 Nov. 11, 2021

Related U.S. Application Data

(60) Provisional application No. 63/105,911, filed on Oct. 27, 2020, provisional application No. 63/022,589, filed on May 11, 2020.

(30) Foreign Application Priority Data

Feb. 8, 2021 (TW) .................................. 110104808

(51) Int. Cl.
  *G06F 3/02* (2006.01)
  *G06F 3/044* (2006.01)
  *H03K 17/96* (2006.01)

(52) U.S. Cl.
  CPC .......... *G06F 3/0213* (2013.01); *G06F 3/0446* (2019.05); *H03K 17/9622* (2013.01); *H03K 2217/9607* (2013.01)

(58) Field of Classification Search
  CPC .. G06F 3/0213; G06F 3/0446; H03K 17/9622
  See application file for complete search history.

(56) References Cited

U.S. PATENT DOCUMENTS

| 4,246,452 | A  | 1/1981 | Chandler |
| 6,204,839 | B1 | 3/2001 | Mato, Jr. |

(Continued)

FOREIGN PATENT DOCUMENTS

| CN | 1217359 C | 8/2005 |
| CN | 101174511 A | 5/2008 |

(Continued)

OTHER PUBLICATIONS

Chan, the specification, including the claims, and drawings in the U.S. Appl. No. 17/195,585, filed Mar. 8, 2021.

(Continued)

*Primary Examiner* — Albert K Wong
(74) *Attorney, Agent, or Firm* — Winston Hsu

(57) ABSTRACT

A keyboard touch electrode module includes a plurality of same electrode matrices, which are arranged along a lengthwise direction and a widthwise direction and formed by a plurality of series of first electrodes and a plurality of series of second electrodes which interlace with each other. Adjacent two of the electrode matrices in the widthwise direction are mis-aligned. The electrode matrices thereon define a plurality of key projection areas, each of which covers a same key-face electrode pattern. A touch keyboard includes a base, a plurality of keycaps, a plurality of supporting structures connected to and between the base and the keycaps, and the keyboard touch electrode module disposed between the base and the keycaps. The keyboard touch electrode module can senses a non-pressing movement on the keycaps. The keycap can move up and down relative to the base and the keyboard touch electrode module through the corresponding supporting structure.

19 Claims, 20 Drawing Sheets

(56) References Cited

U.S. PATENT DOCUMENTS

| | | |
|---|---|---|
| 6,924,789 B2 | 8/2005 | Bick |
| 6,998,856 B2 | 2/2006 | Sterling |
| 8,760,273 B2 | 6/2014 | Casparian |
| 8,901,944 B2 * | 12/2014 | Chai .................. G06F 3/0446 |
| | | 345/173 |
| 9,230,753 B2 | 1/2016 | Chen |
| 9,519,391 B2 * | 12/2016 | Peterson ............ G06F 3/04186 |
| 9,529,485 B2 * | 12/2016 | Peng .................. G06F 3/0443 |
| 9,563,318 B2 * | 2/2017 | Hoshtanar .......... H03K 17/9622 |
| 9,612,666 B2 | 4/2017 | Cho |
| 9,612,667 B2 | 4/2017 | Cho |
| 9,612,668 B2 | 4/2017 | Cho |
| 9,639,173 B2 | 5/2017 | Cho |
| 9,760,192 B2 * | 9/2017 | Peterson ............ H03K 17/9622 |
| 9,880,637 B2 | 1/2018 | Cho |
| 10,268,312 B2 | 4/2019 | Lee |
| 10,289,238 B2 | 5/2019 | Lee |
| 10,416,819 B2 * | 9/2019 | Cho .................. G06F 3/0443 |
| 10,585,493 B2 | 3/2020 | Elias |
| 10,656,714 B2 | 5/2020 | Ligtenberg |
| 11,009,990 B2 | 5/2021 | Lee |
| 11,531,404 B2 * | 12/2022 | Chan .................. G06F 3/0446 |
| 2006/0232557 A1 | 10/2006 | Fallot-Burghardt |
| 2010/0148995 A1 | 6/2010 | Elias |
| 2011/0012845 A1 | 1/2011 | Rothkopf |
| 2012/0306756 A1 | 12/2012 | Lin |
| 2013/0135211 A1 | 5/2013 | Chiang |
| 2014/0034472 A1 | 2/2014 | Krumpelman |
| 2016/0139317 A1 | 5/2016 | Tai |
| 2016/0196936 A1 | 7/2016 | Ding |
| 2016/0209952 A1 | 7/2016 | Lin |
| 2018/0217668 A1 | 8/2018 | Ligtenberg |
| 2020/0012354 A1 | 1/2020 | Cho |
| 2020/0064961 A1 * | 2/2020 | Yasuno ................ G06F 3/044 |

FOREIGN PATENT DOCUMENTS

| | | |
|---|---|---|
| CN | 202600625 U | 12/2012 |
| CN | 203179767 U | 9/2013 |
| CN | 105677074 B | 2/2019 |
| CN | 105204673 B | 3/2019 |
| CN | 109871063 A | 6/2019 |
| CN | 110968200 A | 4/2020 |
| EP | 3 477 438 A1 | 5/2019 |
| TW | M422104 U1 | 2/2012 |
| TW | M430652 U1 | 6/2012 |
| TW | 201310279 A1 | 3/2013 |
| TW | I465964 B | 12/2014 |
| TW | 201821957 A | 6/2018 |
| TW | 201926009 A | 7/2019 |

OTHER PUBLICATIONS

You, the specification, including the claims, and drawings in the U.S. Appl. No. 17/308,990, filed May 5, 2021.

* cited by examiner

KEYBOARD TOUCH ELECTRODE MODULE AND TOUCH KEYBOARD THEREWITH

CROSS REFERENCE TO RELATED APPLICATIONS

This application claims the benefit of U.S. Provisional Application No. 63/022,589 filed on May 11, 2020 and Application No. 63/105,911 filed on Oct. 27, 2020 which are incorporated herein by reference.

BACKGROUND OF THE INVENTION

1. Field of the Invention

The present invention relates to a touch keyboard, and more particularly to a touch keyboard with a keyboard touch electrode module. At least two key projection areas of the touch keyboard that are mis-aligned in a widthwise direction correspond to two same electrode matrices of the keyboard touch electrode module respectively.

2. Description of the Prior Art

Keyboards are mainly used to input text signals into a computer system. After years of development and integration, the layout of the keys on the keyboard has gradually formed an international standard specification.

On the other hand, touchpads can provide users with different optional operations for entering touch signals into a computer system with a single-point touch or a multi-point touch. At present, the touch function has been successfully integrated into the screen. However, an attempt to integrate touch functionality on a physical keyboard without using a touch pad has never achieved satisfactory results in terms of operation/function and structure.

SUMMARY OF THE INVENTION

An objective of the invention is to provide a keyboard touch electrode module, which is structurally integrated into a keyboard to sense non-press movements of an object on the keys of the keyboard.

According to an embodiment of the invention, a keyboard touch electrode module includes an electrode-carrying structure, a plurality of series of first electrodes, and a plurality of series of second electrodes. The plurality of series of first electrodes extend straight parallel to a lengthwise direction and are arranged in parallel and spaced apart in a widthwise direction on the electrode-carrying structure. The plurality of series of second electrodes extend straight parallel to the widthwise direction and arranged in parallel and spaced apart in the lengthwise direction on the electrode-carrying structure. The plurality of series of first electrodes and the plurality of series of second electrodes interlace with each other to form a plurality of same electrode matrices. The plurality of electrode matrices are arranged in the lengthwise direction and the widthwise direction. Adjacent two of the electrode matrices in the widthwise direction are mis-aligned. The plurality of electrode matrices thereon define a plurality of key projection areas. Each electrode matrix corresponds to one key projection area. Each key projection area covers a same key-face electrode pattern.

According to another embodiment of the invention, a keyboard touch electrode module includes a plurality of electrode matrices, continuously arranged in a lengthwise direction and a widthwise direction. Adjacent two of the electrode matrices in the widthwise direction are shifted away from each other in the lengthwise direction and are mis-aligned in the widthwise direction. At least two of the electrode matrices mis-aligned in the widthwise direction are the same. Each the electrode matrix includes a plurality of serial segments of first electrodes and a plurality of serial segments of second electrodes. The plurality of serial segments of first electrodes and the plurality of serial segments of second electrodes interlace with each other.

Another objective of the invention is to provide a touch keyboard, which has a keyboard touch electrode module capable of sensing a non-press movement of an object on keys of the touch keyboard.

According to an embodiment of the invention, a touch keyboard includes a base plate, a plurality of keycaps, a plurality of supporting structures, and a keyboard touch electrode module. The plurality of keycaps are disposed above the base plate. The keyboard touch electrode module is disposed between the base plate and the plurality of keycaps. The plurality of supporting structures are correspondingly connected to and between the base plate and the plurality of keycaps, so that the keycap moves up and down relative to the base plate and the keyboard touch electrode module through the corresponding supporting structure. The keyboard touch electrode module can sense a non-press movement of an object on the plurality of keycaps. The keyboard touch electrode module includes a plurality of series of first electrodes and a plurality of series of second electrodes. The plurality of series of first electrodes and the plurality of series of second electrodes interlace with each other to form a plurality of electrode matrices. The plurality of electrode matrices are arranged in a lengthwise direction and a widthwise direction. Each electrode matrix corresponds to a key projection area. Adjacent two of the electrode matrices in the width direction are shifted away from each other in the lengthwise direction and are mis-aligned in the widthwise direction. Adjacent two of the key projection areas in the width direction are shifted away from each other in the lengthwise direction and are mis-aligned in the widthwise direction. At least two of the electrode matrices mis-aligned in the widthwise direction are the same.

Compared with the prior art, the keyboard touch electrode modules according to the invention arrange the plurality of same electrode matrices to correspond to the mis-aligned key projection areas. For two of the key projection areas mis-aligned in the widthwise direction, the two corresponding electrode matrices use the same design, so that the two corresponding key-face electrode patterns can be the same, the two corresponding key-gap electrode patterns (surrounding the corresponding key-face electrode patterns) can be the same, and the two corresponding through-hole layouts can be the same. Thereby, the design complexity of the electrode layout can be reduced, and the regularity of the electrode sensing performance can be improved, greatly improving the accuracy of the touch operation on the touch keyboard. Furthermore, by a single component structure integrated design of simultaneously forming the plurality of series of electrodes (for sensing non-press movements on the keys and generating touch signals) and trigger electrodes (which are conducted by a physical movement produced by the keys to generate text signals) on the keyboard touch electrode module, the invention can also effectively reduce the thickness of the circuit layer of the touch keyboard, which is conducive to the thin design of the touch keyboard.

These and other objectives of the present invention will no doubt become obvious to those of ordinary skill in the art

DETAILED DESCRIPTION

Figure 1A:
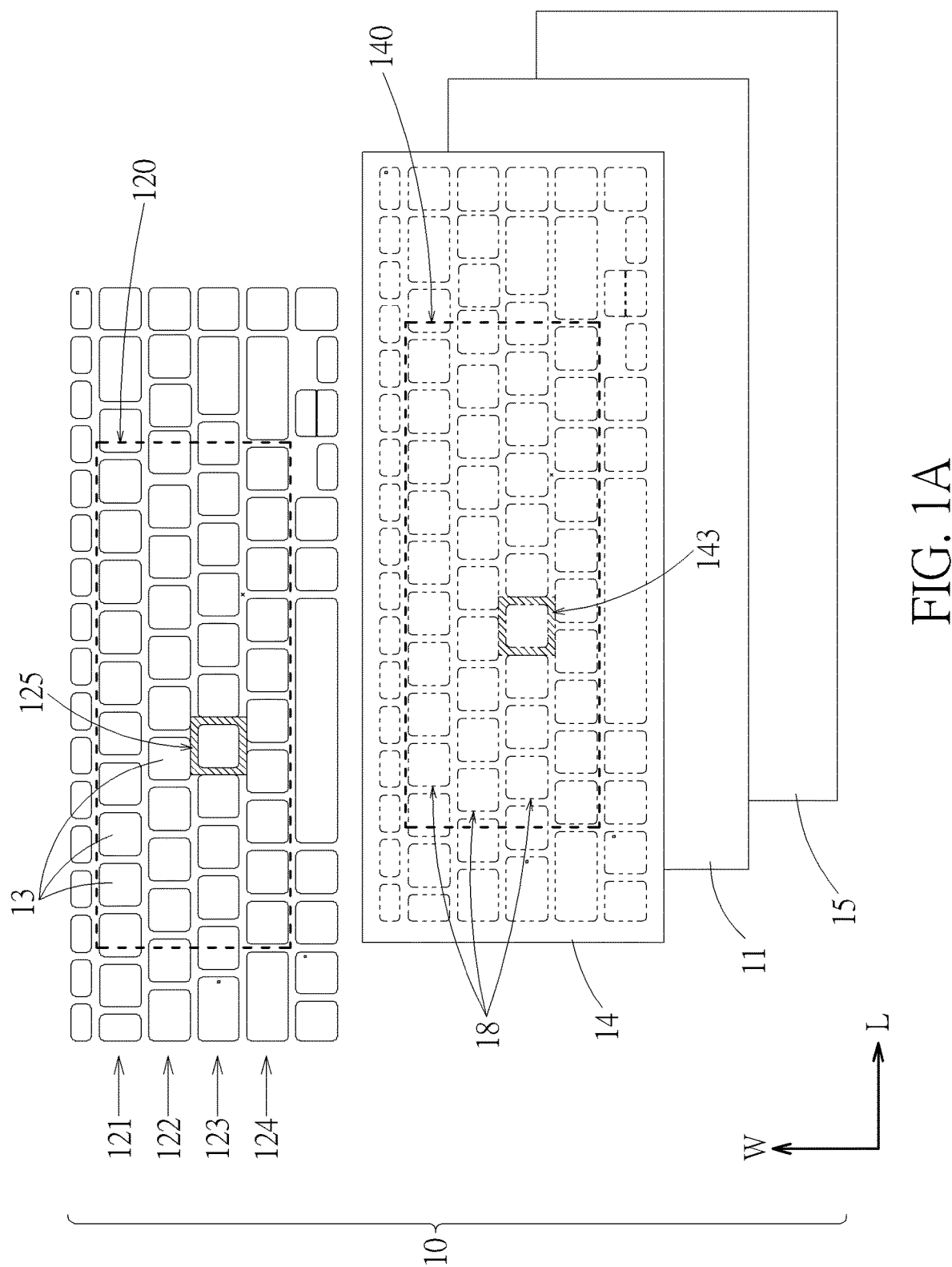
FIG. 1A is a schematic diagram of the decomposition of some components of a touch keyboard of a first embodiment according to the invention.

The present invention relates to how to reliably integrate the touch electrode layer with the computer keyboard. In an ideal state, for a keyboard with a neat matrix arrangement of equal dimensions, the membrane circuit board is usually equipped with a pair of trigger electrodes corresponding to the trigger position of each key. If the keyboard touch electrode module (having X-Y electrodes with neat matrix arrangement) is disposed between the components of the keys, when the key is pressed, the pressed key will press and conduct the pair of trigger electrodes through a rubber elastomer to generate a text signal (for inputting letters/numbers/symbols) to perform a corresponding key input function. When the user does not press the keys, the keyboard touch electrode module can sense capacitance induction values generated by the user's non-press movement (e.g. single-point or multi-point touch/click/continuous movement) on the key surfaces, and then generate touch signals to perform corresponding touch functions. Furthermore, the touch electrode layer can be integrated with the membrane circuit board structure, which is conducive to the thin design of the touch keyboard.

However, for keyboards and keys that are not arranged in a neat matrix arrangement of equal dimensions, the international standard layout adopts a staggered arrangement design. For example, more than text keys with largest proportion, namely square keys or alphanumeric keys, are usually keys for inputting English letters/numbers and several symbols. If the keyboard touch electrode module arranged in a neat matrix is directly superimposed to the keyboard structure, the X-Y axis electrode patterns respectively corresponding to the projection ranges of the text keys are different in principle. In other words, the text keys with the same size but mis-aligned will correspond to different X-Y axis electrode matrix patterns. Since the distribution area of the text keys is the area with the highest input frequency of typing on the keyboard and is also the area with the most opportunity to switch to use the touch function, different X-Y axis electrode matrix patterns will cause the touch event group of each text key area to present a different capacitance sensing data group.

In addition to the limitations of different key dimensions and misalignment of the keys, there are other factors that cause poor touch-sensing performance of the keyboard. The present invention finds several problems. One problem is that when a touch object (e.g. a finger O in FIG. 1B or a touch stylus) moves in the touch area (covering multiple keys and the gaps between them, e.g. the touch area 120 in FIG. 1A), the height of the touch object varies and the medium between the touch object and the touch electrode layer varies. For example, in FIG. 1B, the object O easily falls into a key gap (e.g. the key-gap layout 125) when moving from a key surface to the key gap. The object O has a height difference relative to the touch electrode layout (e.g. the key-gap electrode patterns Mg1, Mg2 and the key-face electrode patterns Mf1, Mf2, Mf3 on the keyboard touch electrode modules 14, 14a~c, 34, 44, 54 in the following embodiments) and a medium difference between the object O and the touch electrode layout when located on the key surface and the key gap, which leads to large variability of touch sensing data. It is difficult to adjust the threshold value (e.g. a certain capacitance) for triggering a touch signal key by key. After all, the key gap mainly includes the air medium (and an additional keyboard frame if it exists) while there are multiple key components under the key surface to allow the key to move up and down. Another problem is the openings on the touch electrode layout, because the touch electrode layout may need to be penetrated by the keyboard frame or key components. In particular, if the multiple openings are inconsistent in the relative position, shape, size and quantity thereof, the shapes/sizes of some touch electrodes will be incomplete and inconsistent, or the positions/numbers will be inconsistent, keeping the variability of touch sensing data high. Because it is too complicated and difficult to customize the configuration of every local sensing area for each key, it is easy to cause mis-triggering or breakpoint triggering failure in different positions of each text key. This brings great challenges to the uniformity or regularization of the keyboard touch sensing, which is also one of the technical problems that the present invention can overcome through the following embodiments.

Figure 1B:
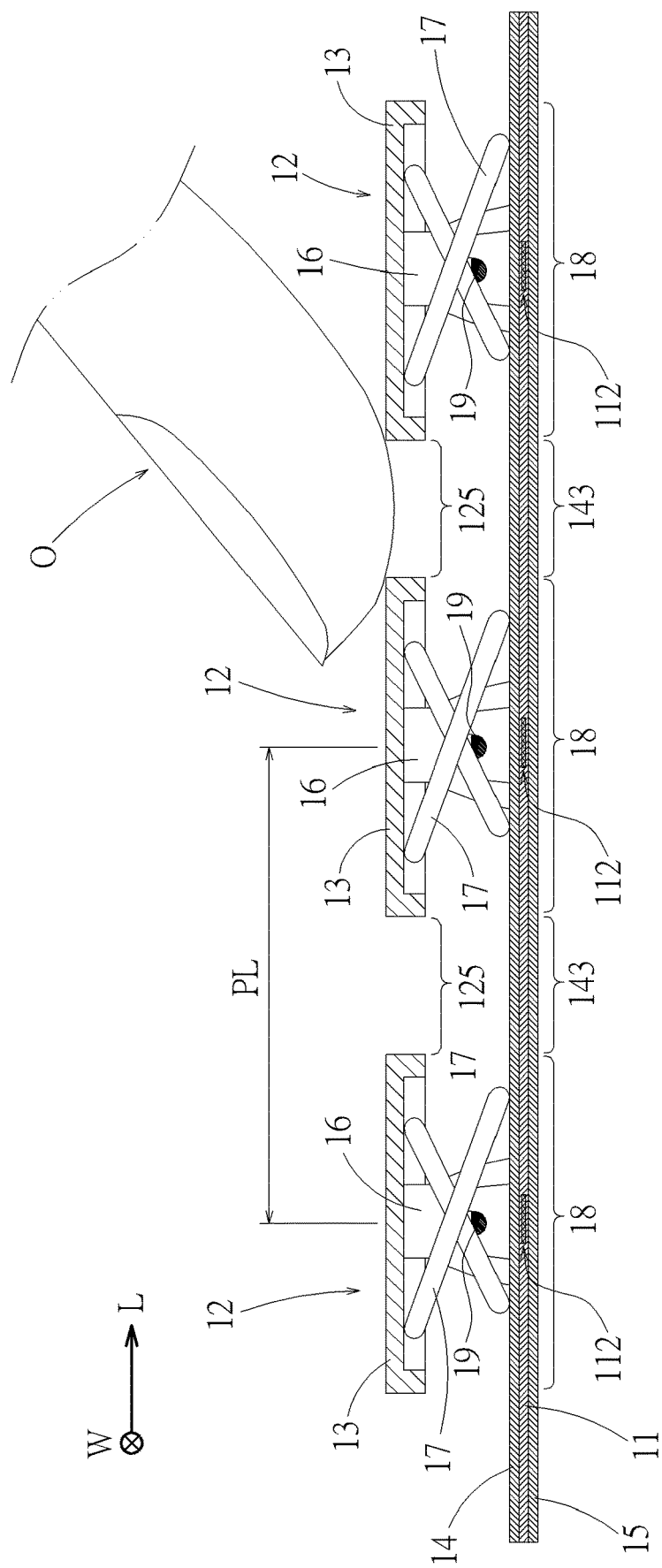
FIG. 1B is a sectional view of a portion of the touch keyboard of the first embodiment according to the invention.

Please refer to FIG. 1A and FIG. 1B. A touch keyboard 10 according to a first embodiment includes a plurality of key structures 12 and a keyboard touch electrode module 14 (shown by a single part in FIG. 1A and FIG. 1B for drawing simplification) structurally integrated into the plurality of key structures 12. The key structure 12 includes a keycap 13, a base plate 15, a resilient reset part 16, and a supporting structure 17 (not shown in FIG. 1A for drawing simplification). The keycap 13 is disposed above the base plate 15. The resilient reset part 16 (e.g. a rubber dome) is disposed between the keycap 13 and the base plate 15. The supporting structure 17 is connected to and between the keycap 13 and the base plate 15. The plurality of key structures 12 use the same base plate 15. The keyboard touch electrode module 14 is disposed between the base plate 15 and the plurality of keycaps 13. The keycap 13 can move up and down relative to the base plate 15 and the keyboard touch electrode module 14 through the corresponding supporting structure 17. The keycap 13 that moves down can squeeze the resilient reset part 16. The resilience of the squeezed resilient reset part 16 can drive the keycap 13 to move upward to its original position. The touch keyboard 10 thereon defines a virtual touch area 120 (only indicated in FIG. 1A) for an object O such as a user's finger or touch stylus to perform touch operation (including non-press movement). The touch area 120 is substantially located at the middle portion of the touch keyboard 10 and covers multiple key structures 12 (or the top side surfaces of the keycaps 13) and the area occupied by a plurality of key-gap layouts 125 (of which one is indicated by a hatched area in FIG. 1A). Each key-gap layout 125 correspondingly surrounds one key structure 12 (or keycap 13). The projection of the touch area 120 on the keyboard touch electrode module 14 is the touch area projection 140 (indicated by a dashed rectangle in FIG. 1A). The projection of the keycaps 13 on the keyboard touch electrode module 14 is the key projection area 18 (indicated by a dashed rectangle in FIG. 1A). The projection of the key-gap layout 125 on the keyboard touch electrode module 14 is the key-gap layout projection 143 (indicated by a hatched area in FIG. 1A). The key-gap layout projection 143 surrounds the corresponding key projection area 18. The touch area projection 140 covers multiple key projection areas 18 and the corresponding key-gap layout projections 143. The keyboard touch electrode module 14 can sense non-press movements of the object O within the touch area 120.

In addition, in the first embodiment, some of the keycaps 13 are text keys with equal dimensions, namely square keys or alphanumeric keys, used for generating text signals for inputting English letters/numbers and several symbols. The others of the keycaps, such as small keys with a smaller size and multi-size keys with a larger size, surround the square keys. Usually the ESC/F1~F12 function keys in the front row are small-sized keys, and the space/Enter/Shift/CapsLock/Ctrl keys are multiple-size keys. Therein, the key structures 12 (or the keycaps 13) corresponding to the touch area 120 are all of the same geometric dimensions (for example, square keys) and arranged in four rows including a first row of keys 121, a second row of keys 122, a third row of keys 123, and a fourth row of keys 124. The key structures 12 of two adjacent rows of keys are mis-aligned in a widthwise direction W (i.e. in a staggered arrangement). The key projection areas 18 are also mis-aligned in the widthwise direction W (i.e. also in a staggered arrangement), as is the key-gap layout projections 143.

Figure 2A:
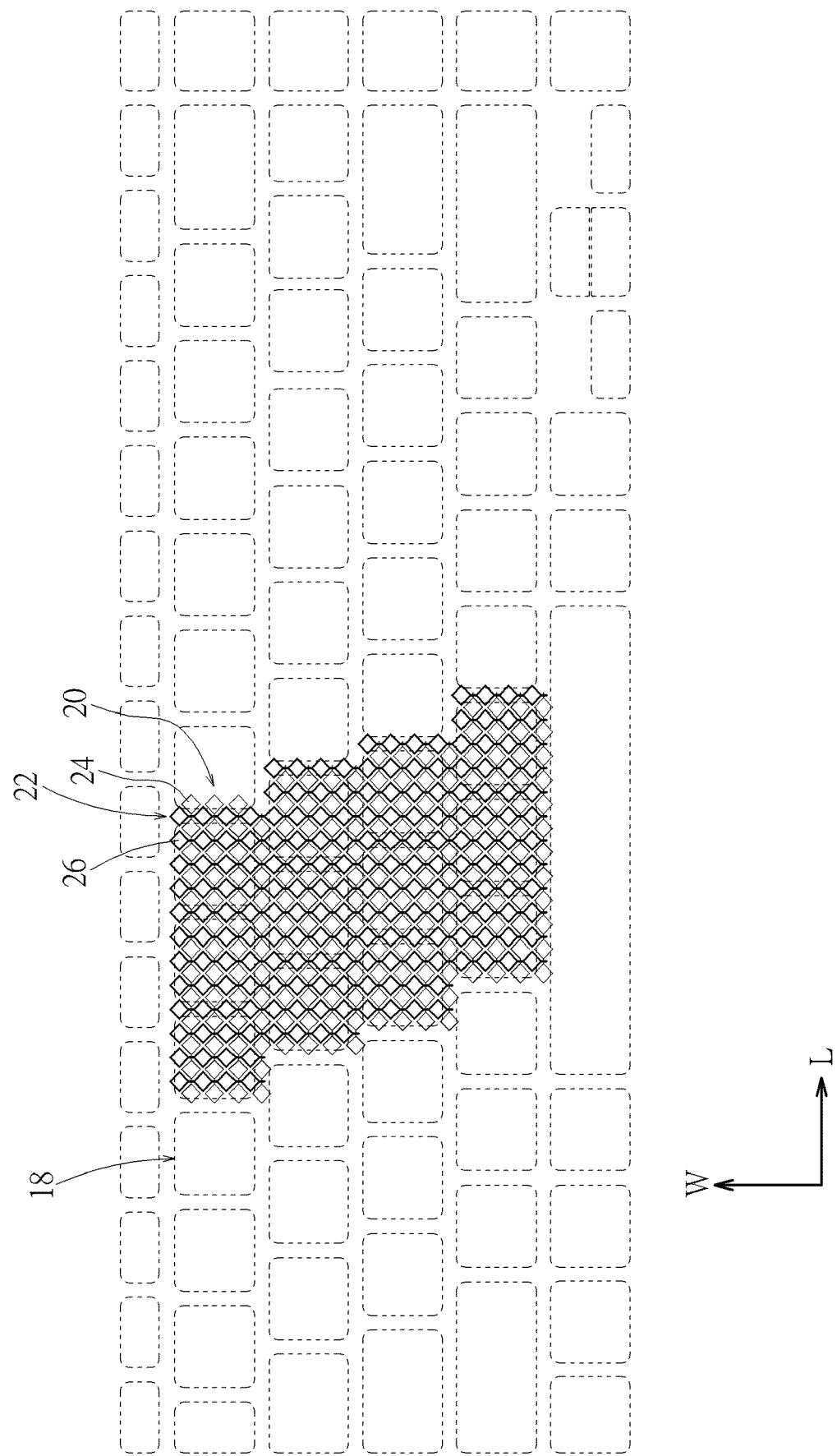
FIG. 2A is a schematic diagram illustrating a portion of the electrode layout of the keyboard touch electrode module in FIG. 1A and FIG. 1B.
Figure 2B:
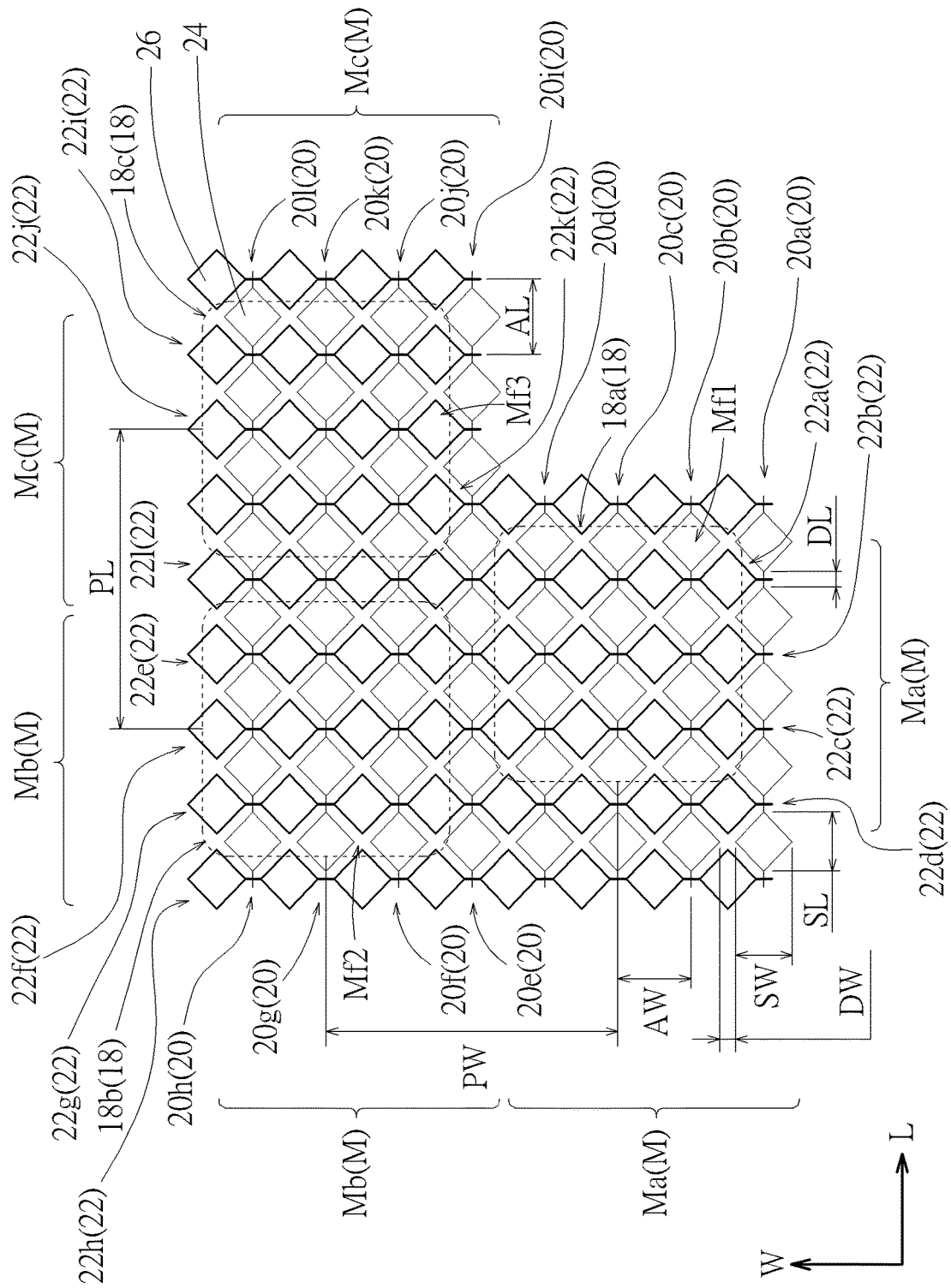
FIG. 2B is an enlarged view of three adjacent electrode matrices in FIG. 2A.

Please also refer to FIG. 2A and FIG. 2B. Therein, in FIG. 2A, only a portion of the electrodes of the keyboard touch electrode module 14 is shown for drawing simplification. Furthermore, in FIG. 2A, the key projection areas 18 are also shown for facilitating the observation of the relative positions of the electrode layout of the keyboard touch electrode module 14 and the key projection areas 18. The keyboard touch electrode module 14 includes a plurality of series of first electrodes 20 (shown in thin solid lines in the figures) and a plurality of series of second electrodes 22 (shown in thick solid lines in the figures). Each series of first electrodes 20 includes a plurality of first electrodes 24 connected in series. Each series of second electrodes 22 includes a plurality of second electrodes 26 connected in series. The plurality of series of first electrodes 20 extend straight parallel to a lengthwise direction L (indicated by an arrow in the figures) and are arranged in parallel and spaced apart in the widthwise direction W (indicated by an arrow in the figures); that is, the first electrodes 24 of each series of first electrodes 20 are connected in a straight line. The plurality of series of second electrodes 22 extend straight parallel to the widthwise direction W and are arranged in parallel and spaced apart in the lengthwise direction L; that is, the second electrodes 26 of each series of second electrodes 22 are connected in a straight line. The plurality of series of first electrodes 20 and the plurality of series of second electrodes 22 interlace with each other and form a uniform distribution of electrodes. The plurality of series of first electrodes 20 and the plurality of series of second electrodes 22 form a plurality of same electrode matrices M, continuously arranged in the lengthwise direction L and the widthwise direction W. Each electrode matrix M has the same electrode layout (including the quantities, relative positions and so on of the first electrodes 24 and the second electrodes 26). The plurality of electrode matrices M correspond to the plurality of key projection areas 18 one to one, so that the electrode matrices M and the key projection areas 18 are arranged in the same configuration. Therein, adjacent two of the electrode matrices M in the widthwise direction W are mis-aligned.

Figure 2C:
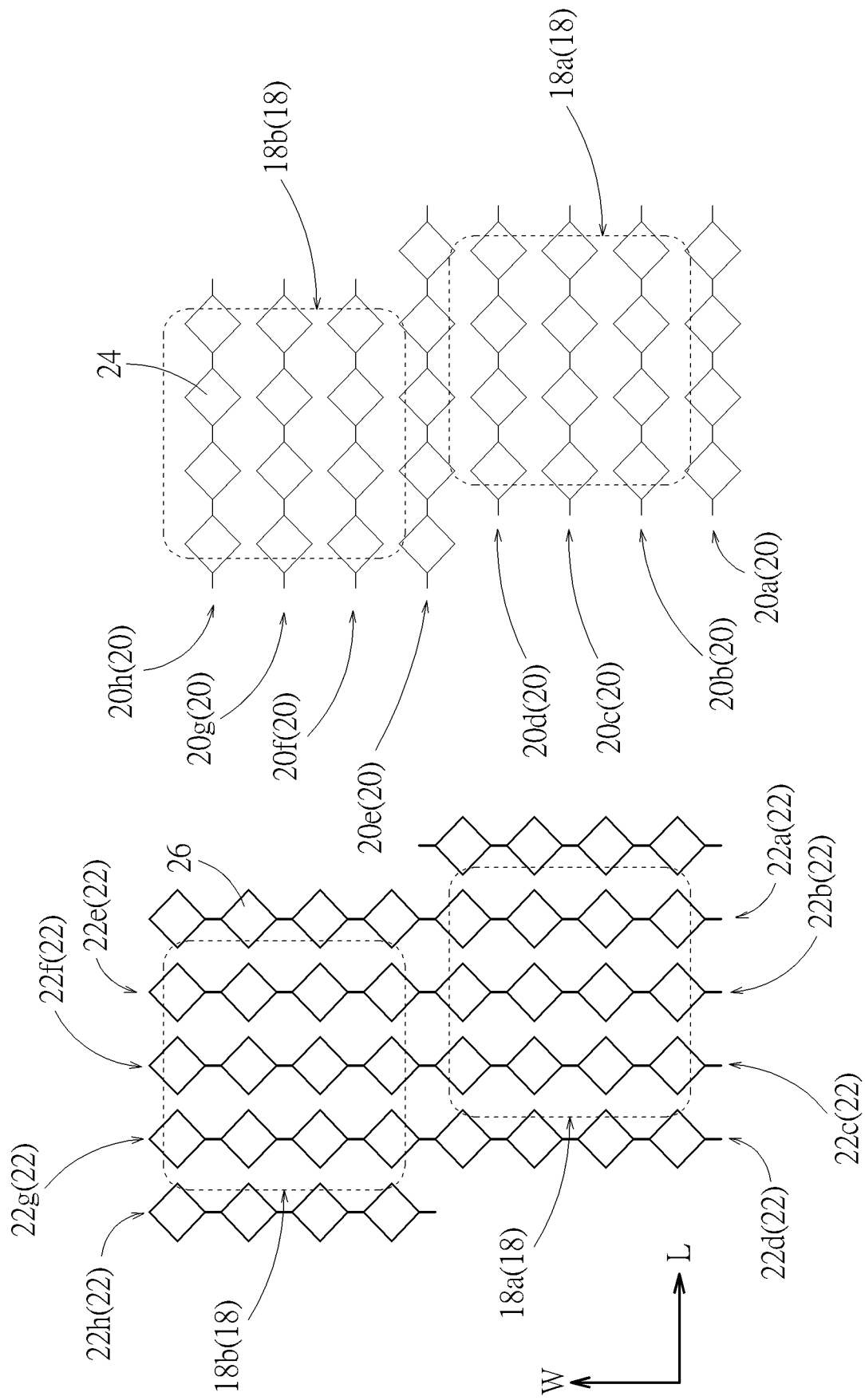
FIG. 2C is a schematic diagram of the decomposition of the electrode matrices in FIG. 2B into a plurality of serial segments of first electrodes and a plurality of serial segments of second electrodes.

As shown by FIG. 2B (which shows three key projection areas 18, marked as 18a~c; for example, the key projection area 18a corresponds to the third row of keys 123, and the key projection areas 18b and 18c correspond to the second row of keys 122), the key projection area 18a is located within the corresponding electrode matrix M (marked as Ma), the key projection area 18b (adjacent to the key projection area 18a in the widthwise direction W) is located within the corresponding electrode matrix M (marked as Mb), and the key projection area 18c (adjacent to the key projection area 18b in the lengthwise direction L) is located within the corresponding electrode matrix M (marked as Mc). Please also refer to FIG. 2C, which separately shows the electrode layouts of the electrode matrices in FIG. 2B corresponding to the series of first electrodes 20 and the series of second electrodes 22 respectively. For the electrode matrix Ma, it includes a plurality of serial segments of first electrodes 20a~d and a plurality of serial segments of second electrodes 22a~d, which interlace with each other. For the electrode matrix Mb, it includes a plurality of serial segments of first electrodes 20e~h and a plurality of serial segments of second electrodes 22e~h, which interlace with each other. For the electrode matrix Mc, it includes a plurality of serial segments of first electrodes 20i~l and a plurality of serial segments of second electrodes 22i~l, which interlace with each other. Therein, the serial segments of first electrodes 20e~h are connected in series to the serial segments of first electrodes 20i~l respectively in the lengthwise direction L. The serial segment of second electrodes 22a is connected in series to the serial segment of second electrodes 22l in the widthwise direction W. The serial segments of second electrodes 22b~d are connected in series to the serial segments of second electrodes 22e~g respectively in the widthwise direction W.

Figure 2D:
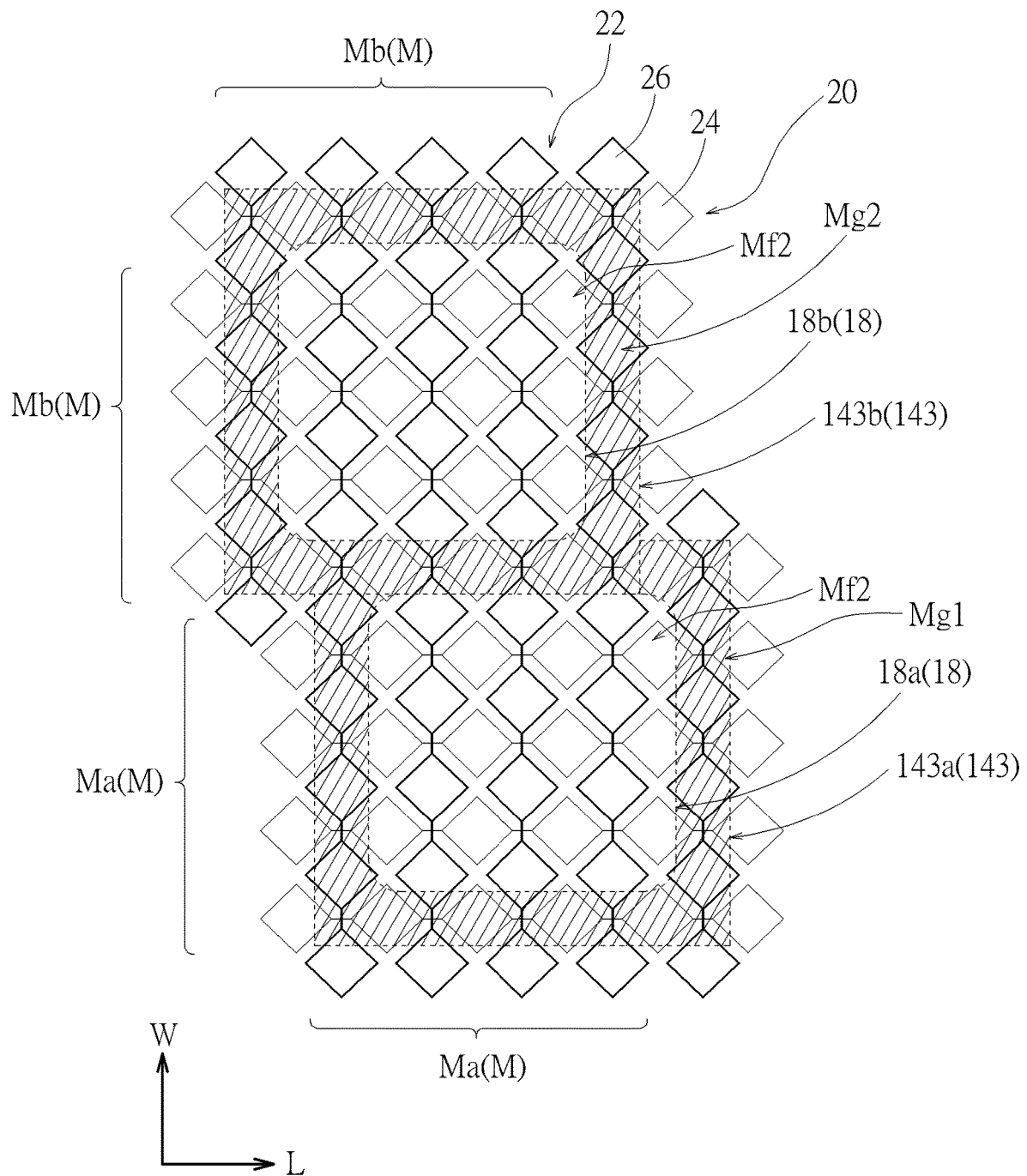
FIG. 2D is an enlarged view of the key-gap layout projections on two adjacent electrode matrices in FIG. 1A.
Figure 2E:
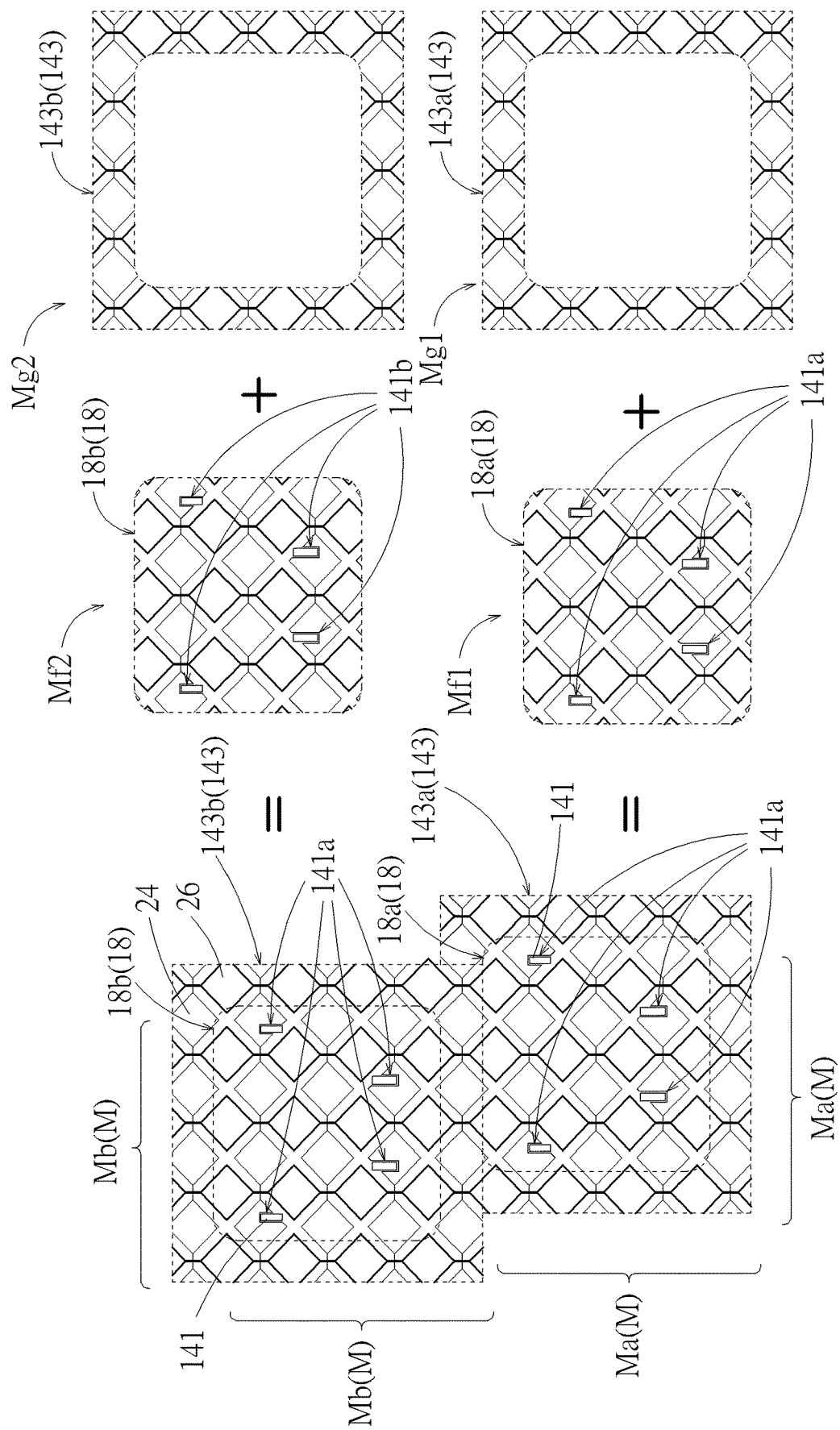
FIG. 2E is a schematic diagram of the composition of the key-face electrode patterns and key-gap electrode patterns of the two electrode matrices in FIG. 2D.

Please also refer to FIG. 2D and FIG. 2E. As shown by FIG. 2D and FIG. 2E, one of the key-gap layout projections 143 (marked as 143a) surrounds the corresponding key projection area 18a (or surrounding the periphery of the corresponding electrode matrix Ma), and another one of the key-gap layout projections 143 (marked as 143b) surrounds the corresponding key projection area 18b (or surrounding the periphery of the corresponding electrode matrix Mb). The key-gap layout projections 143a and 143b overlap where the electrode matrices Ma and Mb (or the key projection areas 18a and 18b) adjoin. As shown by FIG. 2A and FIG. 2B, in the first embodiment, the arrangement of the plurality of series of first electrodes 20 and the plurality of series of second electrodes 22 is specially designed, so that each keycap 13 (or the key structure 12) can correspond to the same electrode layout, which improves the regularity of the touch sensing data, reduces the breakpoints of the touch track, improves the sensitivity of the touch sensing, and can also simplify the design complexity of the touch electrodes.

Therein, the arrangement pitch of the key projection areas 18 in the lengthwise direction L (e.g. the center distance between the key projection area 18b and the key projection area 18c (or adjacent two of the keycaps 13 in the lengthwise direction L) in the lengthwise direction L) is defined as a key center distance PL (as shown by FIG. 2B). The key projection areas 18 corresponding to the first row of keys 121 and the second row of keys 122 are arranged in a shift of ½ of the key center distance PL. The key projection areas 18 corresponding to the second row of keys 122 and the third row of keys 123 are arranged in a shift of ¼ of the key center distance PL. The key projection areas 18 corresponding to the third row of keys 123 and the fourth row of keys 124 are arranged in a shift of ½ of the key center distance PL. Each electrode matrix M (e.g. the electrode matrix Ma) includes four serial segments of first electrodes 20a~d and four serial segments of second electrodes 22a~d. Therefore, as shown by FIG. 2B, taking the electrode matrix Ma and the electrode matrix Mb as an example, ¼ of the key center distance PL by which the electrode matrix Ma is shifted to the right in the lengthwise direction L relative to the electrode matrix Mb is exactly a multiple (i.e. 1 in this embodiment) of an arrangement pitch AL of the series of second electrodes 22 in the lengthwise direction L, so the serial segments of second electrodes 22b~d of the electrode matrix Ma are aligned with the serial segments of series of second electrodes 22e~g of the electrode matrix Mb respectively. This alignment result also occurs between other electrode matrices M corresponding to different rows of keys, and will not be repeated in addition. Furthermore, the arrangement pitch of the electrode matrix Mb and the electrode matrix Mc in the lengthwise direction L (i.e. the key center distance PL) is a multiple (i.e. 4 in this embodiment) of the arrangement pitch AL, so the electrode matrix Mb and the electrode matrix Mc can correspond to the same layout of the series of second electrodes 22. The corresponding result of this electrode layout also occurs among the other electrode matrices M corresponding to the same row of keys, and will not be repeated in addition. Furthermore, in the first embodiment, the arrangement pitch of the key projection areas 18 in the widthwise direction W (e.g. the center distance between the key projection area 18a and the key projection area 18b in the widthwise direction W) is defined as a key center distance PW, which is four times of an arrangement pitch AW of the series of first electrodes 20 in the widthwise direction W. Thereby, adjacent two of the electrode matrices M in the widthwise direction W (e.g. the electrode matrix Ma and the electrode matrix Mb) can correspond to the same layout of the series of first electrodes 20. Therefore, in the first embodiment, the key-face electrode patterns of the electrode matrices M covered by the corresponding key projection areas 18 are the same. For example, the key-face electrode patterns Mf1, Mf2 and Mf3 covered by the key projection areas 18a~c respectively are the same (as shown by FIG. 2B and FIG. 2E). The key-gap electrode patterns covered by the corresponding key-gap layout projections 143 are the same. For example, the key-gap electrode patterns Mg1 and Mg2 covered by the key-gap layout projections 143a~b respectively are the same (as shown by FIG. 2E).

In addition, in the first embodiment, the keyboard touch electrode module 14 is located between the base plate 15 and the keycap 13, so the keyboard touch electrode module 14 has a plurality of through holes 141 (only shown in FIG. 2E for drawing simplification) for providing the space required for connecting the supporting structures 17 and the base plate 15. The through holes 141 are located under the keycap 13, which will affect the key-face electrode pattern. As shown by FIG. 2E, the key-face electrode pattern Mf1 of the key projection area 18a has a through-hole layout 141a (or defined by the through holes 141 on the corresponding key projection area 18a). The key-face electrode pattern Mf2 of the key projection area 18b has a through-hole layout 141b (or defined by the through holes 141 on the corresponding key projection area 18b). The through-hole layouts 141a and 141b are the same.

In addition, as shown by FIG. 1A and FIG. 1B, in the first embodiment, the touch keyboard 10 further includes a membrane circuit board 11 (shown by a single part in FIGS. 1A and 1B for drawing simplification), disposed between the keyboard touch electrode module 14 and the base plate 15. For each key structure 12 (or each key projection area 18), the membrane circuit board 11 includes a corresponding key switch 112 (located under the corresponding keycap 13 and shown by a single block in FIG. 1B). The keycap 13 can be pressed down to trigger the corresponding key switch 112 (by squeezing the keyboard touch electrode module 14 and the membrane circuit board 11 through the resilient reset part 16). In practice, the membrane circuit board 11 may be a three-layer structure, which includes two opposite substrates and a spacer layer sandwiched between them. Switch circuitry is provided on the opposite surfaces of the substrates to form a key switch 112. In the first embodiment, the membrane circuit board 11 and the keyboard touch electrode module 14 are sequentially and flatly stacked flat on the base plate 15. For example, the membrane circuit board 11 and the keyboard touch electrode module 14 are combined by, but not limited to, glue. For different instances, the keyboard touch electrode module 14 needs to be disposed above the metal/conductive base plate 15, or selectively disposed above or below the non-metal/non-conductive base plate 15.

Figure 3:
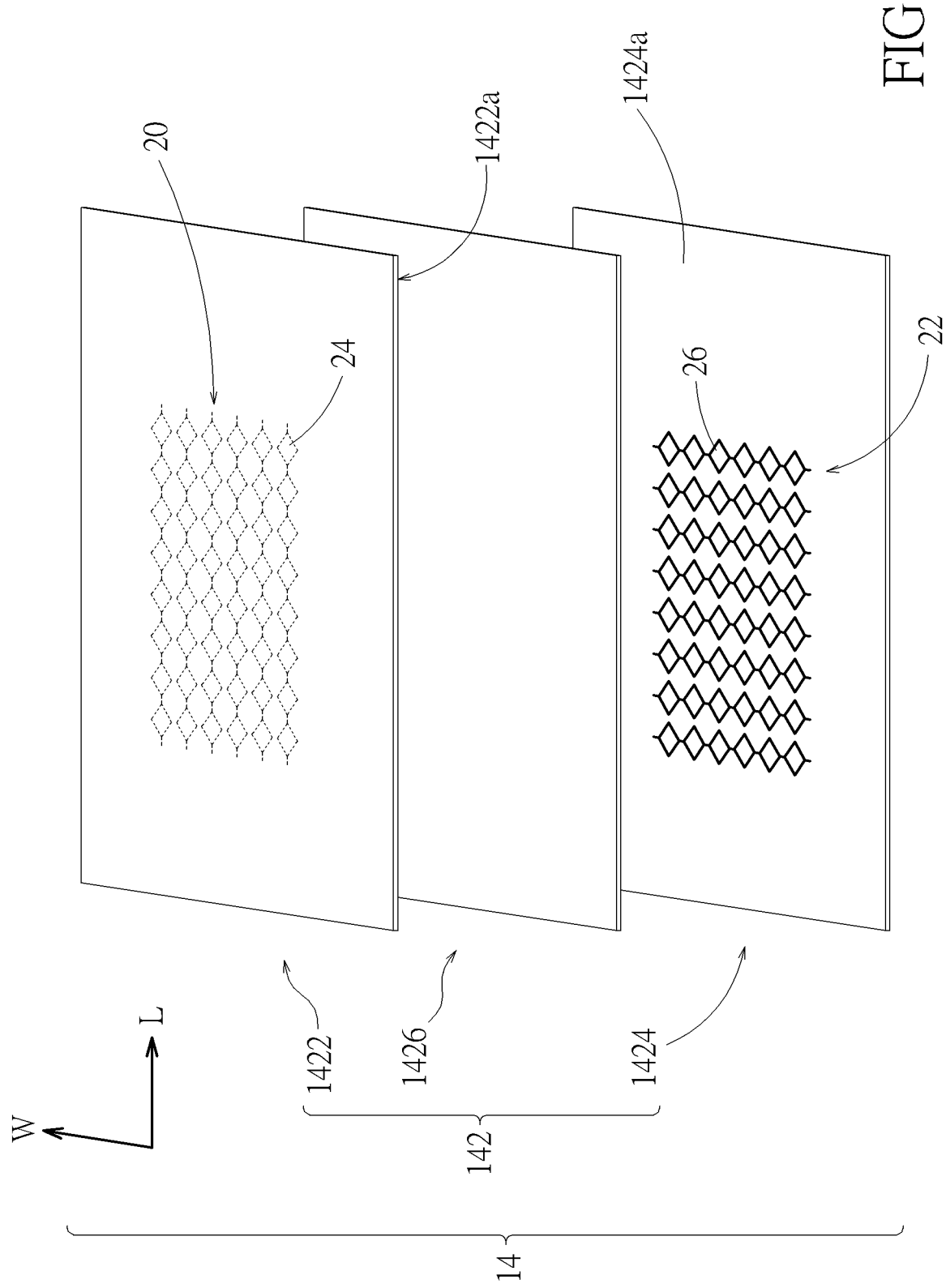
FIG. 3 is a schematic diagram of the decomposition of the keyboard touch electrode module in FIG. 1A and FIG. 1B.

Please also refer to FIG. 3; therein, the series of first electrodes 20 and the series of second electrodes 22 are shown exaggeratedly in FIG. 3 for drawing simplification. In the first embodiment, the keyboard touch electrode module 14 carries the plurality of series of first electrodes 20 and the plurality of series of second electrodes 22 by an electrode-carrying structure 142. The electrode-carrying structure 142 includes a first substrate 1422, a second substrate 1424 disposed opposite to the first substrate 1422, and a spacer layer 1426 sandwiched by the first and second substrates 1422 and 1424. The plurality of series of first electrodes 20 are formed on a first inner side surface 1422a of the first substrate 1422 (toward the second substrate 1424). The plurality of series of second electrodes 22 are formed on a second inner side surface 1424a of the second substrate 1424 (toward the first substrate 1422). The spacer layer 142c can provide insulation between the plurality of series of first electrodes 20 and the plurality of series of second electrodes 22. In addition, the view point of FIG. 3 is not limited to be the same as the view point of FIG. 1A; in other words, in practice, the keyboard touch electrode module 14 may be arranged such that the second substrate 1424 is between the first substrate 1422 and the membrane circuit board 11 or the first substrate 1422 is between the second substrate 1424 and the membrane circuit board 11.

Figure 4:
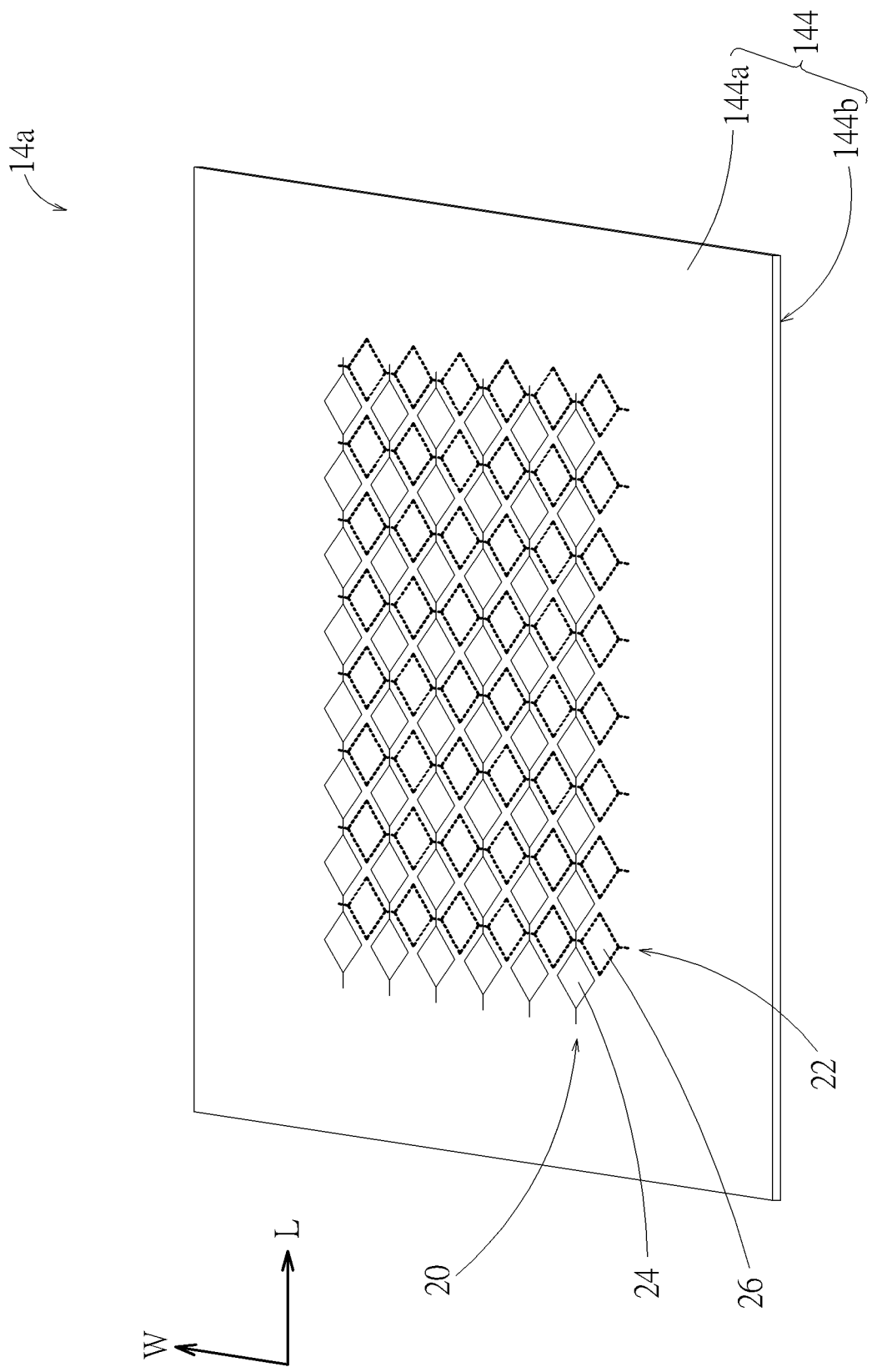
FIG. 4 is a schematic diagram of the keyboard touch electrode module in FIG. 1A and FIG. 1B according to a variant.

In the first embodiment, the electrode-carrying structure 142 is implemented in a three-layer structure; however, it is not limited thereto in practice. For example, as shown by FIG. 4, a keyboard touch electrode module 14a according to a variant carries the plurality of series of first electrodes 20 and the plurality of series of second electrodes 22 by an electrode-carrying structure 144 of a single substrate. Therein, the plurality of series of first electrodes 20 are formed on an upper surface 144a of the electrode-carrying structure. The plurality of series of second electrodes 22 are formed on a lower surface 144b of the electrode-carrying structure 144. The electrode-carrying structure 144 itself provides insulation between the plurality of series of first electrodes 20 and the plurality of series of second electrodes 22. In this configuration, in practice, the plurality of series of first electrodes 20 and the plurality of series of second electrodes 22 can be covered with a protective layer (not shown in the figure) to provide protection and insulation at the same time.

Figure 5:
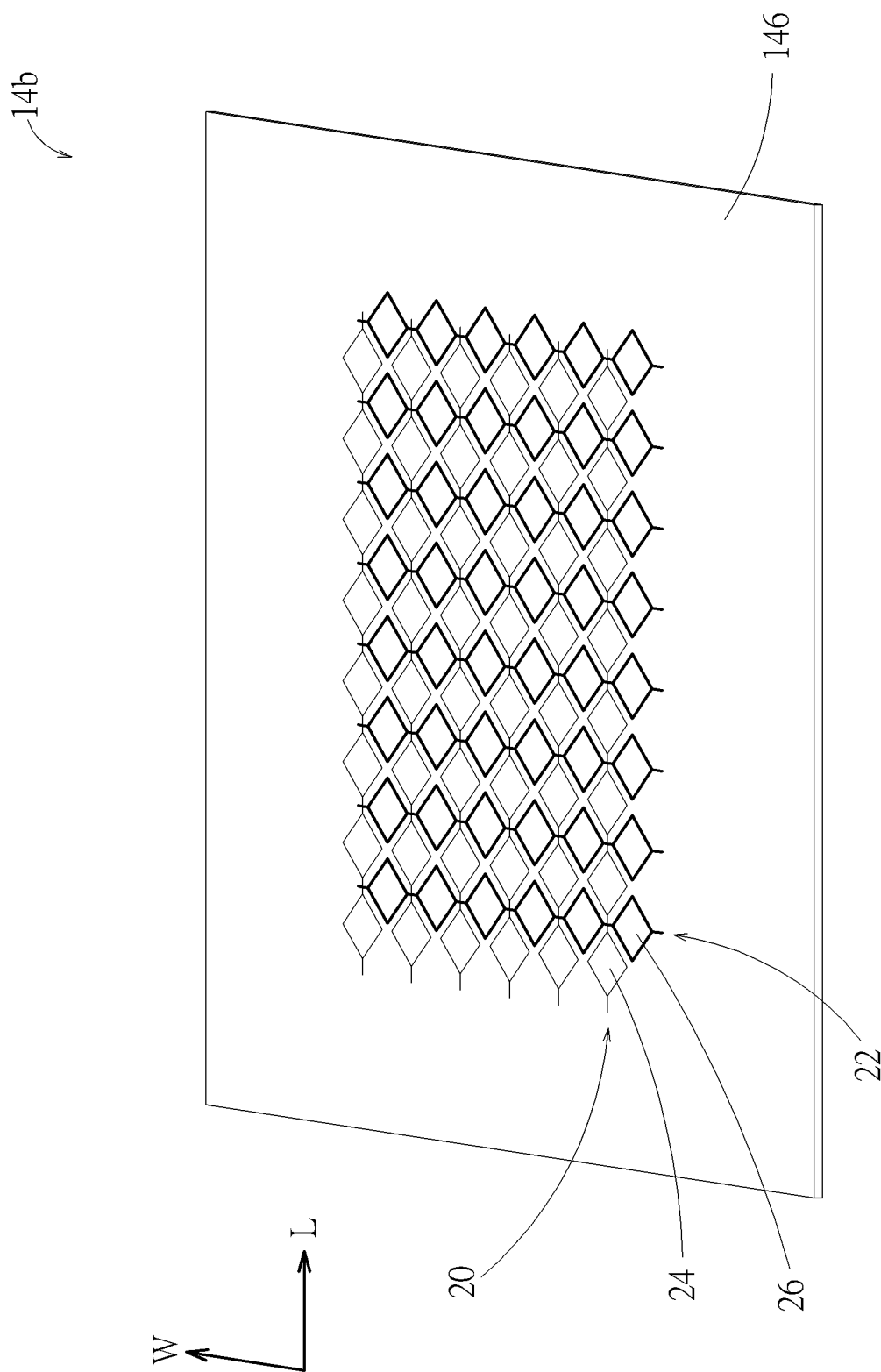
FIG. 5 is a schematic diagram of the keyboard touch electrode module in FIG. 1A and FIG. 1B according to another variant.

For another example, as shown by FIG. 5, a keyboard touch electrode module 14b according to another variant also carries the plurality of series of first electrodes 20 and the plurality of series of second electrodes 22 by an electrode-carrying structure 146 of a single substrate. Therein, an insulating structure may be disposed at the intersection of the series of first electrodes 20 and the series of second electrodes 22 to prevent the connection wires between the first electrodes 24 and the connection wires of the second electrodes 26 from touching each other. For example, first, the whole series of first electrodes 20 and the second electrodes 26 of the series of second electrodes 22 are formed on the electrode-carrying structure 146, and then the connection wires between the first electrodes 24 is covered with an insulating film (which does not cover the second electrodes 26). Finally, the connection wires between the second electrodes 26 are formed on the insulating film to complete the disposition of the plurality of series of second electrodes 22. Similarly, in this configuration, in practice, the plurality of series of first electrodes 20 and the plurality of series of second electrodes 22 can be covered with a protective layer (not shown in the figure) to provide protection and insulation at the same time.

Figure 6:
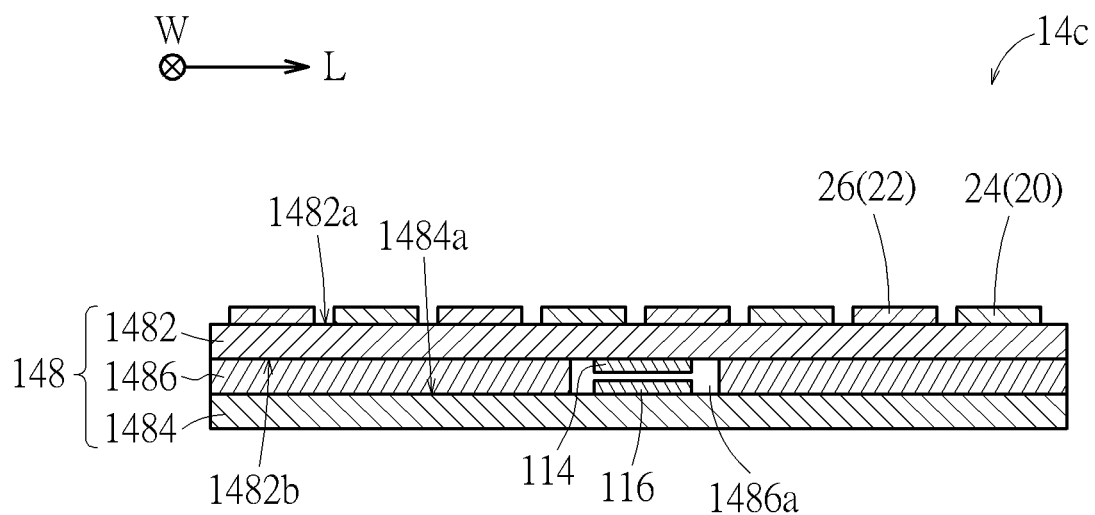
FIG. 6 is a sectional view of the keyboard touch electrode module in FIG. 1A and FIG. 1B according to another variant.

For another example, as shown by FIG. 6, an electrode-carrying structure 148 of a keyboard touch electrode module 14c according to another variant includes a first substrate 1482, a second substrate 1484 disposed opposite to the first substrate 1482, and a spacer layer 1486 sandwiched by the first and second substrates 1482 and 1484. The plurality of series of first electrodes 20 and the plurality of series of second electrodes 22 are formed on a first outer side surface 1482a of the first substrate 1482 (for its manufacturing method, please refer to the relevant descriptions about FIG. 5). The spacer layer 1486 has an opening 1486a. A first trigger conductive portion 114 and a second trigger conductive portion 116 are formed oppositely and separately corresponding to the opening 1486a on a first inner side surface 1482b of the first substrate 1482 and a second inner side surface 1484a of the second substrate 1484 respectively. The first trigger conductive portion 114 and the second trigger conductive portion 116 therefore form a key switch (e.g. the aforementioned key switch 112). The portion of the keyboard touch electrode module 14c corresponding to the first and second trigger conductive portions 114 and 116 is operable to be pressed to make the first and second trigger conductive portions 114 and 116 approach each other through the opening 1486a. In practice, switch circuits connected to the first trigger conductive portion 114 and the second trigger conductive portion 116 are formed on the first inner side surface 1482b and the second inner side surface 1484a for sensing the contact status of the first and second trigger conductive portions 114 and 116.

Figure 7:
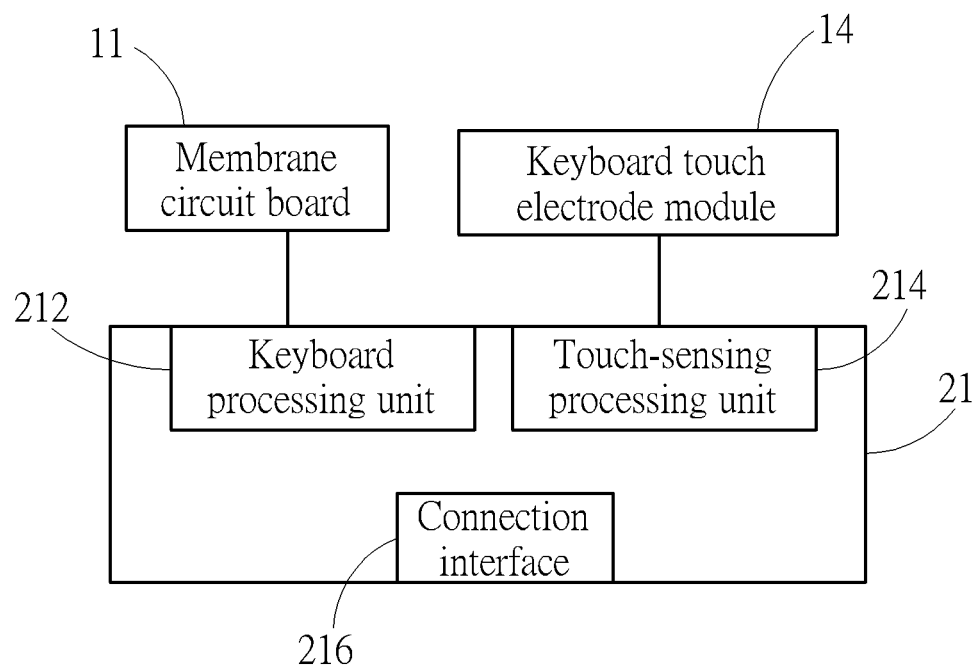
FIG. 7 is a functional block diagram of the touch keyboard of the first embodiment according to the present invention.

Please refer to FIG. 7. In the foregoing first embodiment and related variants, the touch keyboard 10 can use a control module 21 to monitor the electrical status of the membrane circuit board 11 and the keyboard touch electrode module 14. The control module 21 includes a keyboard processing unit 212 and a touch-sensing processing unit 214. The keyboard processing unit 212 is electrically connected to the membrane circuit board 11 for sensing the status of the key switch 112. The touch-sensing processing unit 214 is electrically connected to the keyboard touch electrode module 14 for sensing the capacitance of the electrodes. The control module 21 outputs the sensing results through a connection interface 216, for example, outputting an alphanumeric input corresponding to the key structure 12, a touch position in the touch area 120, and so on.

Figure 8:
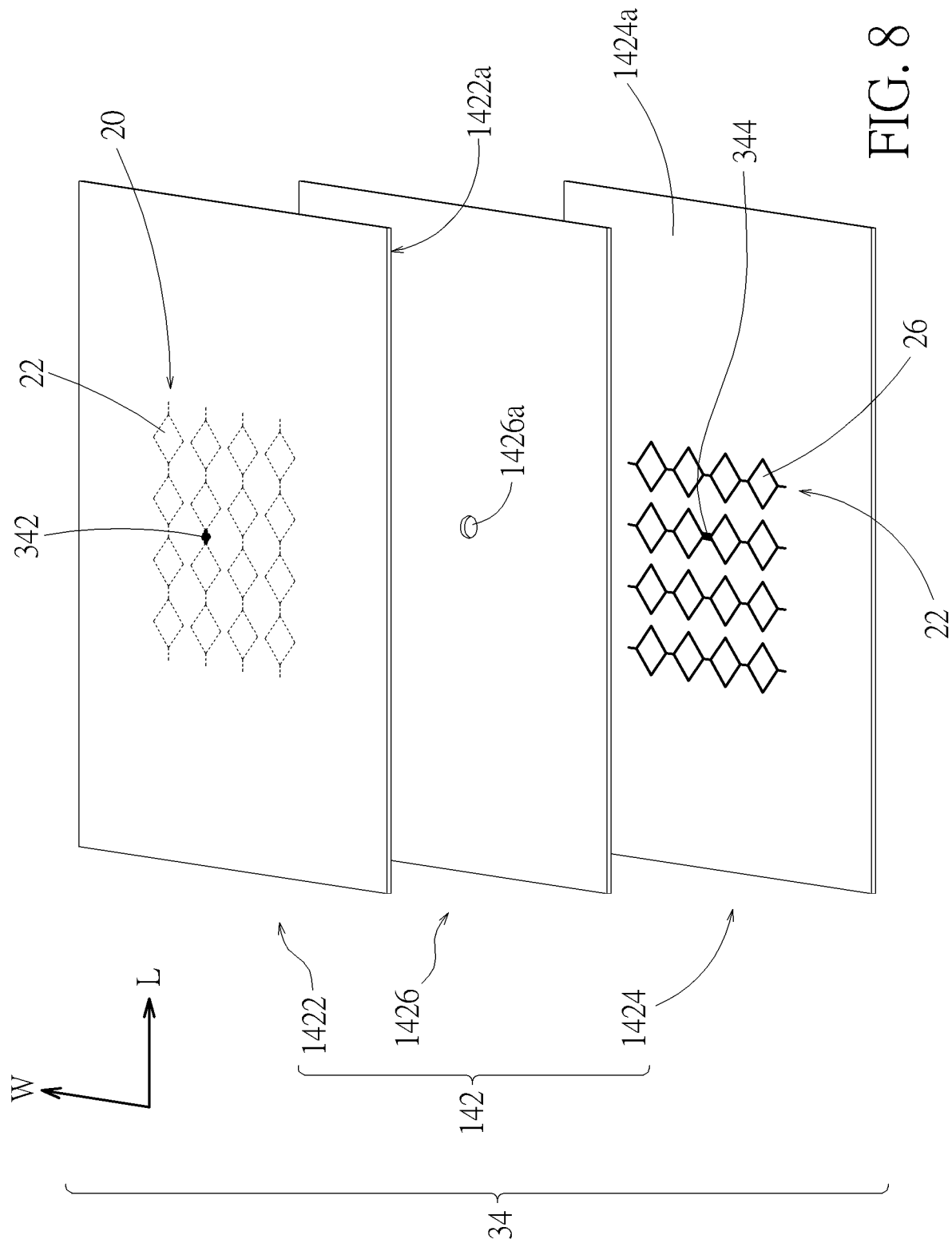
FIG. 8 is a schematic diagram of the decomposition of some components of a keyboard touch electrode module of a second embodiment according to the invention.
Figure 9:
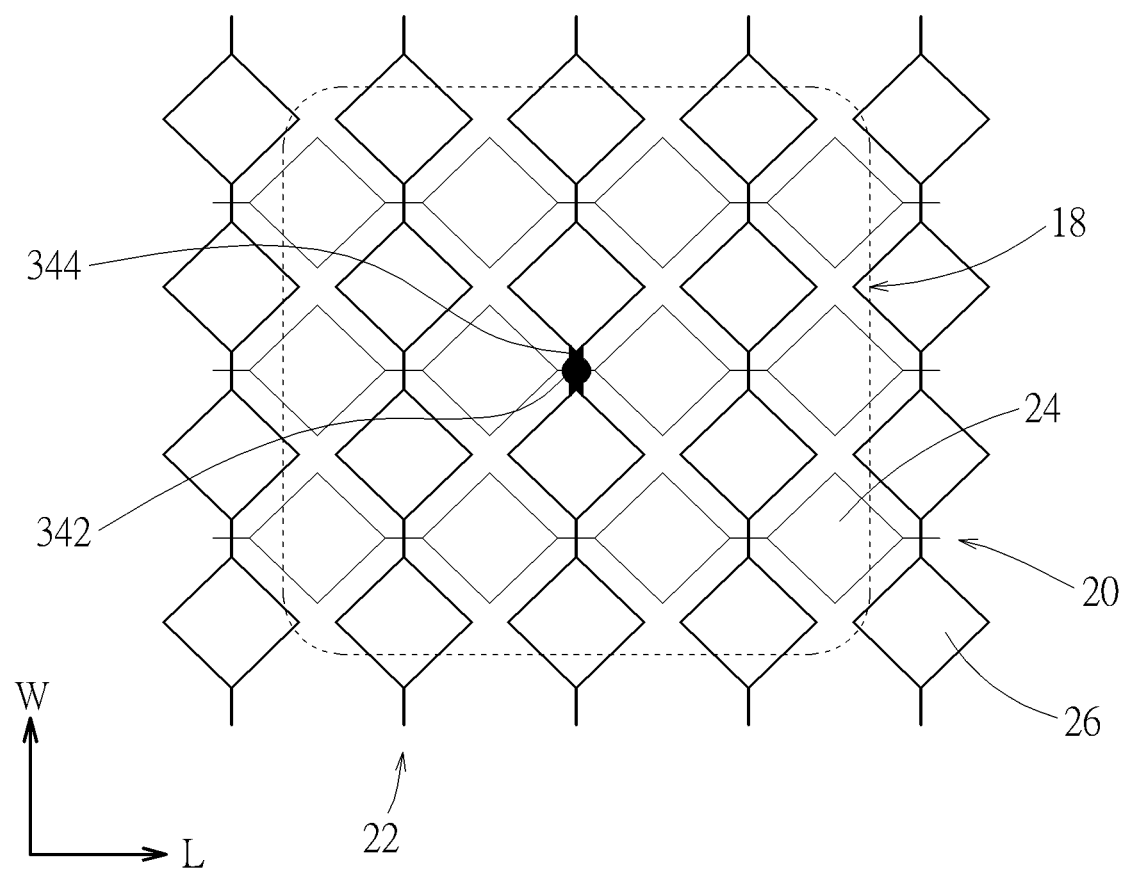
FIG. 9 is a schematic diagram illustrating the electrode layout of the keyboard touch electrode module in FIG. 8.

In the foregoing first embodiment and related variants, touch operation sensing and key operation sensing are implemented separately in structure; however, it is not limited thereto in practice. As shown by FIG. 8 and FIG. 9, a keyboard touch electrode module 34 (of which the series of first electrodes 20 and the series of second electrodes 22 are shown exaggeratedly in the figures for drawing simplification) of a second embodiment according to the invention is structurally similar to the keyboard touch electrode module 14, and uses the reference numbers used in the keyboard touch electrode module 14. For other descriptions about the keyboard touch electrode module 34, please refer to the relevant descriptions of the keyboard touch electrode module 14, which will not be repeated in addition. For the convenience of description, FIG. 8 and FIG. 9 mainly show only a portion of the keyboard touch electrode module 34 corresponding to one key projection area 18. A main difference between the keyboard touch electrode module 34 and the keyboard touch electrode module 14 is that the keyboard touch electrode module 34 integrates key switches into the electrode layout thereof. In the second embodiment, the keyboard touch electrode module 34 includes a first trigger conductive portion 342 and a second trigger conductive portion 344 for each key projection area 18. The first trigger conductive portion 342 and the second trigger conductive portion 344 are located within the corresponding key projection area 18 and formed by extending from one series of first electrodes 20 and one series of second electrodes 22 respectively. The spacer layer 1426 of the electrode-carrying structure 142 of the keyboard touch electrode module 34 has an opening 1426a. The first and second trigger conductive portions 342 and 344 are disposed oppositely and separately corresponding to the opening 1426a; that is, in the normal state, the first and second trigger conductive portions 342 and 344 do not touch each other. The first and second trigger conductive portions 342 and 344 form one key switch. The portion of the keyboard touch electrode module 34 corresponding to the first and second trigger conductive portions 342 and 344 is operable to be pressed (e.g. through the resilient reset part 16 in FIG. 1B) to make the first and second trigger conductive portions 342 and 344 approach each other through the opening 1426a, i.e. triggering the key switch.

Figure 10:
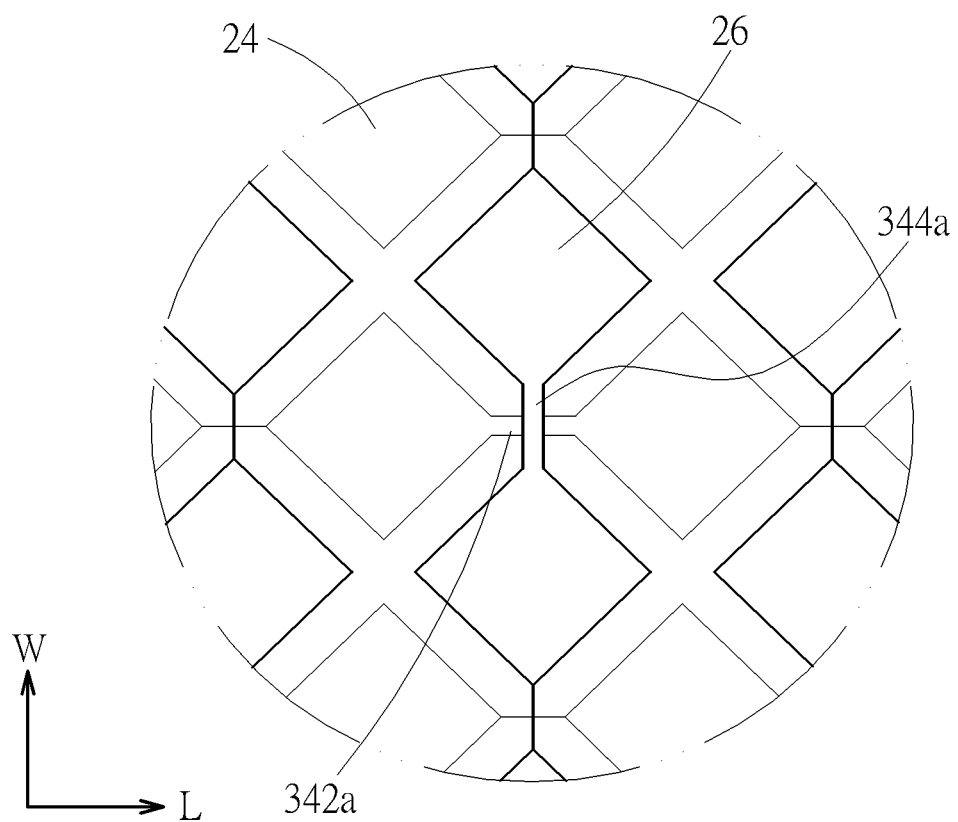
FIG. 10 is a schematic diagram of the first and second trigger conductive portions in FIG. 8 and FIG. 9 according to a variant.
Figure 11:
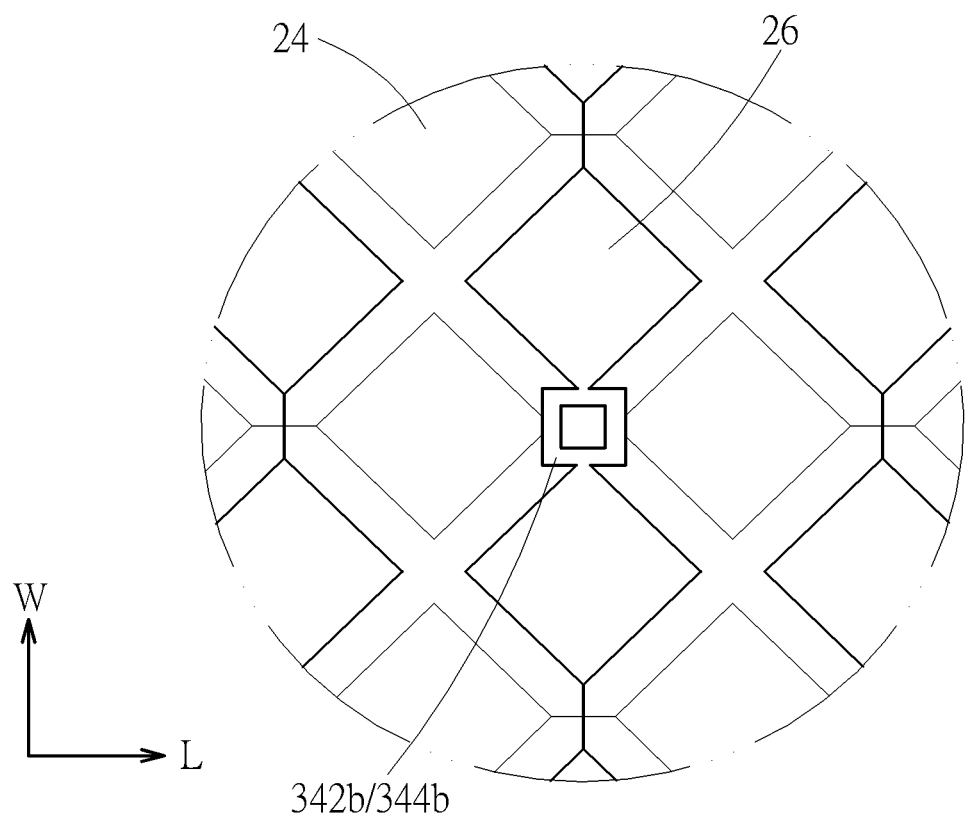
FIG. 11 to FIG. 14 are schematic diagrams of the first and second trigger conductive portions in FIG. 8 and FIG. 9 according to various variants.
Figure 12:
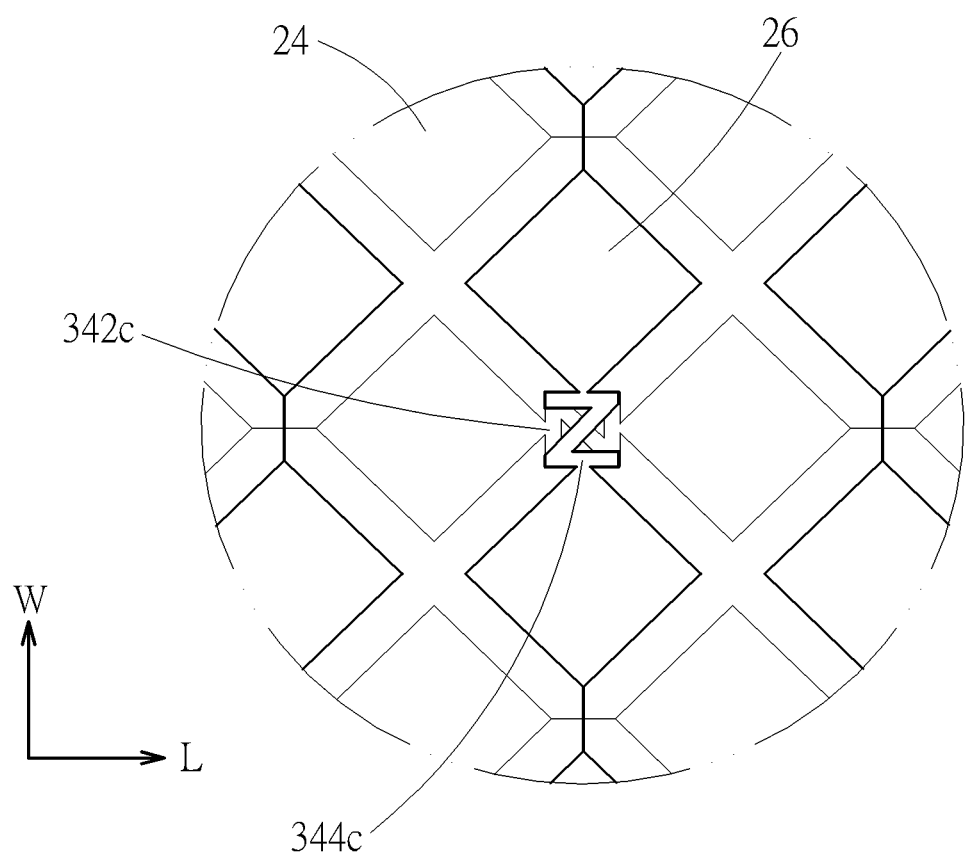
Figure 13:
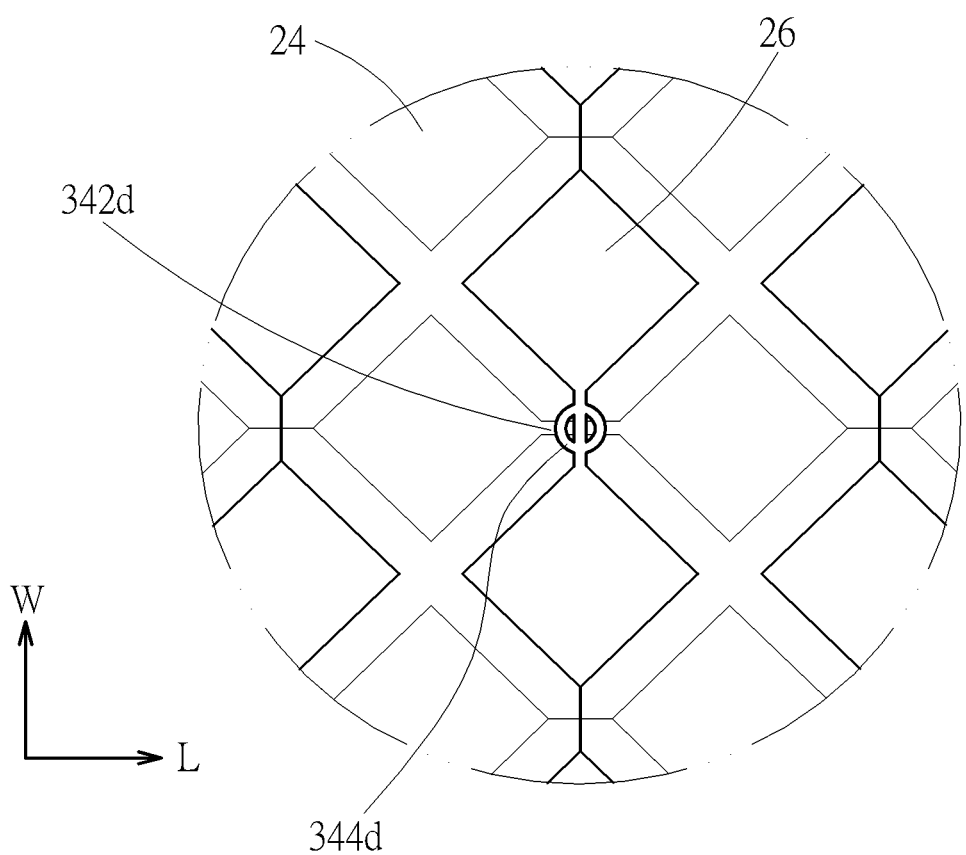
Figure 14:
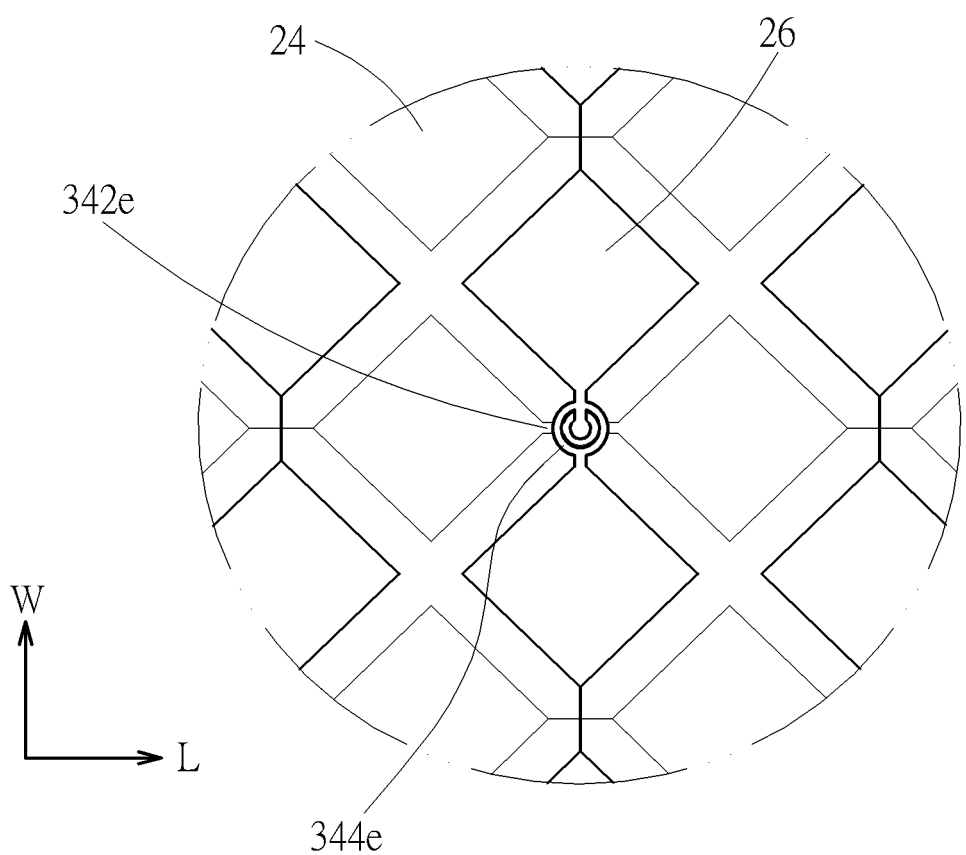

In the second embodiment, the first trigger conductive portion 342 is a contact surface (e.g. but not limited to being formed in a circle). The second trigger conductive portion 344 is a contact line (e.g. by directly thickening the connection wire between the second electrodes 26). The first trigger conductive portion 342 and the second trigger conductive portion 344 overlap in the vertical direction (perpendicular to the lengthwise direction L and the widthwise direction W). However, it is not limited thereto. For example, FIG. 10 shows a schematic diagram of the respective contours of first and second trigger conductive portions 342a and 344a and the superposition of the two. Both of the first and second trigger conductive portions 342a and 344a are contact lines, and both are straight lines. For another example, FIG. 11 shows a schematic diagram of the respective contours of first and second trigger conductive portions 342b and 344b and the superposition of the two. Both of the first and second trigger conductive portions 342b and 344b are contact lines, and both are rectangular and have the same size. For another example, FIG. 11 shows a schematic diagram of the respective contours of first and second trigger conductive portions 342c and 344c and the superposition of the two. Both of the first and second trigger conductive portions 342c and 344c are contact lines, and both are zigzags. Therein, the first trigger conductive portion 342c is n-shaped, and the second trigger conductive portion 344c is z-shaped. In structural logic, the first and second trigger conductive portions 342b, 344b, 342c, and 344c can also be regarded as a combination of multiple contact lines. For another example, FIG. 13 shows a schematic diagram of the respective contours of first and second trigger conductive portions 342d and 344d and the superposition of the two. The first trigger conductive portion 342d is a contact line and is a straight line, and the second trigger conductive portion 344d includes two contact lines, namely a straight line and a ring. For another example, FIG. 14 shows a schematic diagram of the respective contours of first and second trigger conductive portions 342e and 344e and the superposition of the two. The first trigger conductive portion 342e is a circular contact surface, and the second trigger conductive portion 344e includes a circular contact surface, a straight contact line, and a ring contact line. In practice, the contact line may be a curve, a ring, a rectangle, a zigzag, or any combination thereof. The contact surface can be any geometric shape (for example, convex polygon). The above are only suitable examples for the first and second trigger conductive portions; however, the first and second trigger conductive portions are not limited thereto in practice. Furthermore, the first and second trigger conductive portions 342, 342a~e, 344 and 344a~e are connected in series in the first electrode series 20 and the second electrode series 22, but it is not limited thereto in practice. For example, in accordance with the actual product design, the first and second trigger conductive portions may be formed by extending from one connection wire between the electrodes of the corresponding series of electrodes or from one electrode of the corresponding series of electrodes. In addition, in the above embodiments, in practice, if the first and second trigger conductive portions are implemented in a line type, the line width thereof is in principle wider than that of the connection lines between the electrodes to increase the contact surface area.

Figure 15:
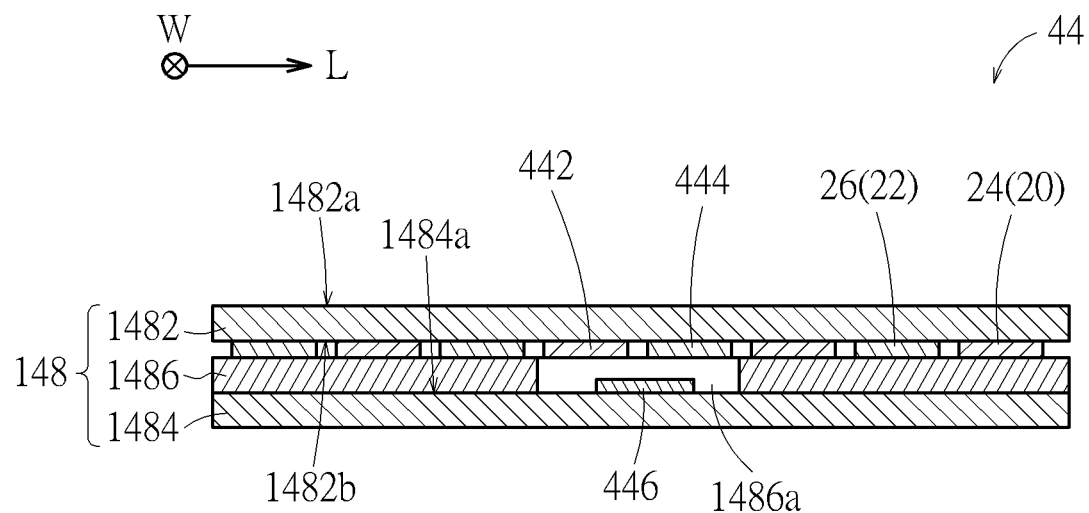
FIG. 15 is a sectional view of a portion of a keyboard touch electrode module of a third embodiment according to the invention.

In addition, a keyboard touch electrode module 44 of a third embodiment according to the invention is structurally similar to the keyboard touch electrode module 14c, and uses the reference numbers used in the keyboard touch electrode module 14c. For other descriptions about the keyboard touch electrode module 44, please refer to the relevant descriptions of the keyboard touch electrode module 14c, which will not be repeated in addition. For the convenience of description, FIG. 15 mainly shows only a portion of the keyboard touch electrode module 44 corresponding to one key projection area 18. A main difference between the keyboard touch electrode module 44 and the keyboard touch electrode module 14c is that the series of first electrodes 20 and the series of second electrodes 20 of the keyboard touch electrode module 44 are located inside the electrode-carrying structure 148 (on the first inner side surface 1482b), and the keyboard touch electrode module 44 integrates key switches into the electrode layout thereof. In the third embodiment, the keyboard touch electrode module 44 includes a first trigger conductive portion 442, a second trigger conductive portion 444, and a conductive connection portion 446 for each key projection area 18. The first trigger conductive portion 442 is formed by extending from one of the series of first electrodes 20 (for example, from one first electrode 24 or one connection line between the first electrodes 24) or by one first electrode 24 in the series of first electrodes 20 (that is, this first electrode 24 also serves as the first trigger conductive portion 442). The second trigger conductive portion 444 is formed by extending from one of the series of second electrodes 22 (for example, from one second electrode 26 or one connection line between the second electrodes 26) or by one second electrode 26 in the series of second electrodes 22 (that is, this second electrode 26 also serves as the second trigger conductive portion 444). The conductive connection portion 446 is formed on the second inner side surface 1484a of the second substrate 1484 corresponding to the opening 1486a. The first and second trigger conductive portions 442 and 444 and the conductive connection portion 446 are located within the corresponding key projection area 18. The conductive connection portion 446 is disposed opposite to and separated from the first and second trigger conductive portions 442 and 444 corresponding to the opening 1486a. The first and second trigger conductive portions 442 and 444 and the conductive connection portion 446 form one key switch. The portion of the keyboard touch electrode module 44 corresponding to the first and second trigger conductive portions 442 and 444 is operable to be pressed to make the conductive connection portion 446 approach the first and second trigger conductive portions 442 and 444 at the same time through the opening 1486a.

In the third embodiment, the first and second trigger conductive portions 442 and 444 are conducted by the conductive connection portion 446 inside the electrode carrying structure 148. However, in practice, the keyboard touch electrode module 44 may be modified such that the first and second trigger conductive portions 442 and 444 is conducted by a conductive portion 19 (as shown in FIG. 1B) protruding downward from the resilient reset part 16. In this variant, the first and second trigger conductive portions 442 and 444 are formed on the first outer side surface 1482a of the first substrate 1482 together with the series of first electrodes 20 and the series of second electrodes 22, so that the conductive portion 19 can touch the first and second trigger conductive portions 442 and 444. Therein, the second substrate 1484 and the spacer layer 1486 may be omitted. The series of first electrodes 20 and the series of second electrodes 22 can be covered with a protective layer, but the first and second trigger conductive portions 442 and 444 need to be exposed for the conductive portion 19 to touch.

Figure 16:
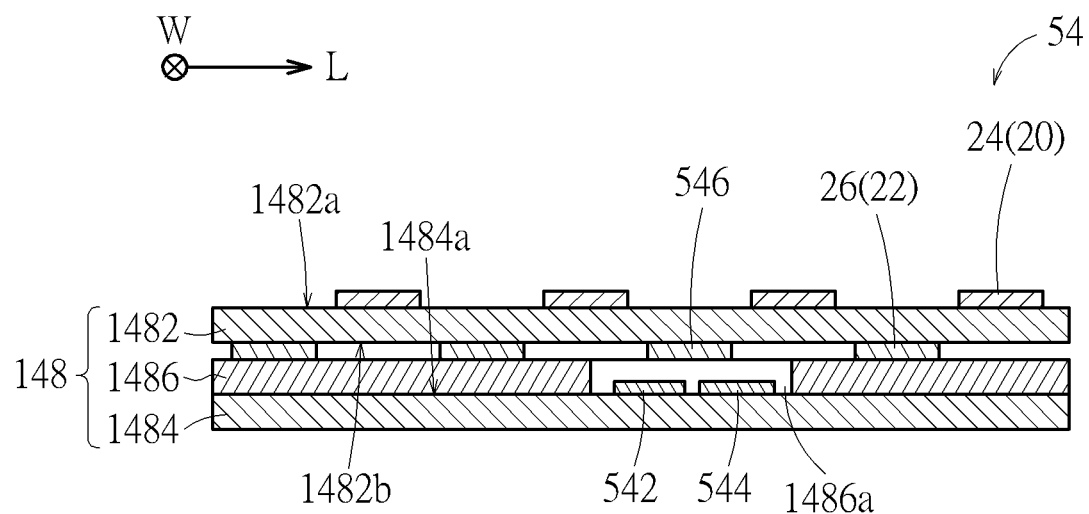
FIG. 16 is a sectional view of a portion of a keyboard touch electrode module of a fourth embodiment according to the invention.

In addition, a keyboard touch electrode module 54 of a fourth embodiment according to the invention is structurally similar to the keyboard touch electrode module 44, and uses the reference numbers used in the keyboard touch electrode module 44. For other descriptions about the keyboard touch electrode module 54, please refer to the relevant descriptions of the keyboard touch electrode module 44, which will not be repeated in addition. For the convenience of description, FIG. 16 mainly shows only a portion of the keyboard touch electrode module 54 corresponding to one key projection area 18. A main difference between the keyboard touch electrode module 54 and the keyboard touch electrode module 44 is that the series of first electrodes 20 of the keyboard touch electrode module 54 are located on the first outer side surface 1482a of the first substrate 1482. In the fourth embodiment, a first trigger conductive portion 542 and a second trigger conductive portion 544 of the keyboard touch electrode module 54 are formed separately on the second inner side surface 1484a of the second substrate 1484. A conductive connection portion 546 is formed by extending from one of the series of second electrodes 22 (for example, from one second electrode 26 or one connection line between the second electrodes 26) or by one second electrode 26 in the series of second electrodes 22 (that is, this second electrode 26 also serves as the conductive connection portion 546). The first and second trigger conductive portions 542 and 544 and the conductive connection portion 546 are located within the corresponding key projection area 18. The conductive connection portion 546 is disposed opposite to and separated from the first and second trigger conductive portions 542 and 544 corresponding to the opening 1486a. The first and second trigger conductive portions 542 and 544 and the conductive connection portion 546 form one key switch. The portion of the keyboard touch electrode module 54 corresponding to the first and second trigger conductive portions 542 and 544 is operable to be pressed to make the conductive connection portion 546 approach the first and second trigger conductive portions 542 and 544 at the same time through the opening 1486a. Similarly, in a variant of the keyboard touch electrode module 54, the series of first electrodes 20 are located on the first inner side surface 1482b of the first substrate 1482. The series of second electrodes 22 are located on the first outer side surface 1482a of the first substrate 1482. The conductive connection portion 546 is formed by extending from one of the series of first electrodes 20 (for example, from one first electrode 24 or one connection line between the first electrodes 24) or by one first electrode 24 in the series of first electrodes 20 (that is, this first electrode 24 also serves as the conductive connection portion 546). The first and second trigger conductive portions 542 and 544 and the conductive connection portion 546 also may form one key switch which can be triggered by pressing the keyboard touch electrode module 54.

Figure 17:
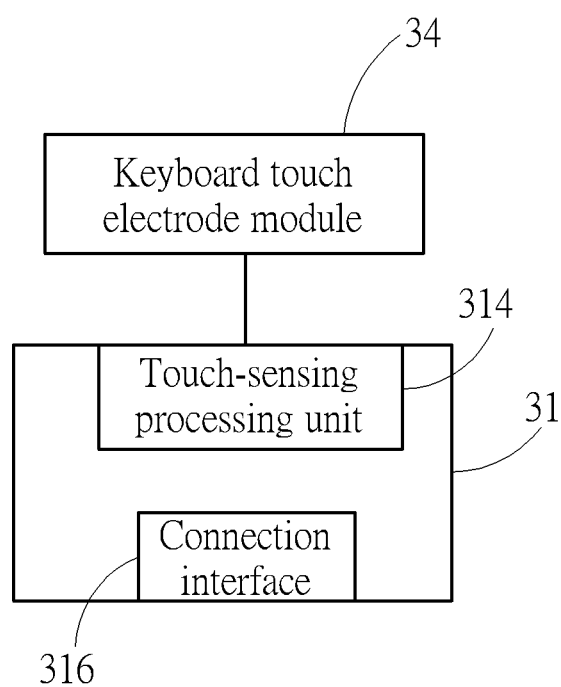
FIG. 17 is a functional block diagram of a touch keyboard with the keyboard touch electrode module of the second embodiment according to the present invention.

In the second to fourth embodiments and the variants thereof, the key switches and the keyboard touch electrode modules 34, 44 and 54 are structurally integrated, so in principle, key operations (e.g. triggering key switches) and touch operations on the touch area 120 can be sensed only by monitoring the electrical status of the keyboard touch electrode modules 34, 44, and 54. Taking the second embodiment as an example, as shown by FIG. 17, a control module 31 includes a touch-sensing processing unit 314 and a connection interface 316. The touch-sensing processing unit 314 is electrically connected to the keyboard touch electrode module 34 for sensing the capacitance of the electrodes. In practice, it is practicable to predetermine two sets of capacitance threshold intervals corresponding to key operations and touch operations respectively. The control module 31 outputs the sensing results through a connection interface 316, for example, outputting an alphanumeric input corresponding to the key structure 12, a touch position in the touch area 120, and so on.

In addition, in the second to fourth embodiments and the variants thereof, the key-triggering mechanism is based on the mutual contact of the first and second trigger conductive portions and the conductive connection portion, but it is not limited thereto in practice. In principle, after the keycap 13 is pressed by a figure, the pressing can produce a large change in the capacitance of the keyboard touch electrode module 34, which can be used to determine whether the finger presses the keycap 13 in the vertical direction (perpendicular to the lengthwise direction L and the widthwise direction W). For example, in the second embodiment, when the keyboard touch electrode module 34 is pressed, the first and second trigger conductive portions 342 and 344 can produce capacitance changes by only closing to each other without physical touch. The capacitance changes can be sensed by the touch-sensing processing unit 314 and used as a basis for determining whether the key is triggered (for example, when a capacitance change reaches a threshold value, it is determined as a key triggering). At the same time, when pressing down, the finger can also change the capacitance. Furthermore, the bottom surface of the resilient reset part 16 may be coated with conductive material (e.g. the conductive portion 19 protruding downward from the resilient reset part 16 in FIG. 1B is coated with conductive carbon particles), which helps to increase the change of the capacitance when the finger presses down. In practice, the accuracy of the touch-sensing processing unit 314 can be enhanced by setting the operation mode (for example, setting the keyboard touch electrode module 34 to a key operation mode or a touch operation module according to actual usage requirements). Similarly, in the first embodiment, it is practicable to realize key operation sensing only by the keyboard touch electrode module 14. For example, when pressing down, the finger can also change the capacitance of the keyboard touch electrode module 14, which can be used to determine whether any key operation occurs. Similarly, the bottom surface of the resilient reset part 16 may be coated with conductive material (e.g. the conductive portion 19 protruding downward from the resilient reset part 16 in FIG. 1B is coated with conductive carbon particles), which helps to increase the change of the capacitance when the finger presses down.

In addition, in the first embodiment, the arrangement of the plurality of series of first electrodes 20 and the plurality of series of second electrodes 22 is specially designed, so that each keycap 13 (or key structure 12) can correspond to the same electrode layout. Please refer to FIG. 2A and FIG. 2B. The plurality of series of first electrodes 20 and the plurality of series of second electrodes 22 interlace with each other to form the uniform distribution of electrodes. Therein, the arrangement pitch AL of the series of second electrodes 22 in the lengthwise direction L is equivalent to the arrangement pitch of the adjacent first electrodes 24 in the lengthwise direction L. The arrangement pitch AW of the series of first electrodes 20 in the widthwise direction W is equivalent to the arrangement pitch of the adjacent second electrodes 26 in the widthwise direction W. In practice, each first electrode 24 has the same profile in principle. A dimension SW of the first electrode 24 (or the second electrode 26) in the widthwise direction W is a function of the key center distance PW, a gap DW between two adjacent first electrodes 24 (or two adjacent second electrodes 26) in the widthwise direction W, and a quantity of the first electrodes 24 (or the second electrodes 26) covered by the key center distance PW. A dimension SL of the first electrode 24 (or the second electrode 26) in the lengthwise direction L is a function of the key center distance PL, a gap DL between two adjacent first electrodes 24 (or two adjacent second electrodes 26) in the lengthwise direction L, and a quantity of the first electrodes 24 (or the second electrodes 26) covered by the key center distance PL. For example:

$$SW=(PW-DW*NW)/NW;$$

$$SL=(PL-DL*NL)/NL;$$

Therein, PW represents the key center distance PW of two adjacent key projection areas 18 (e.g. the key projection area 18a/18b or the electrode matrix Ma/Mb in FIG. 2B) in the widthwise direction W. PL represents the key center distance PL of two adjacent key projection areas 18 (e.g. the key projection area 18b/18c or the electrode matrix Mb/Mc in FIG. 2B) in the lengthwise direction L. DW represents the gap DW of two adjacent electrodes (two first electrodes 24/two second electrodes 26) in the key projection area (e.g. the key projection area 18a/18b/18c in FIG. 2B) or the electrode matrix M (e.g. the electrode matrix Ma/Mb/Mc in FIG. 2B) in the widthwise direction W. DL represents the gap DL of two adjacent electrodes (two first electrodes 24/two second electrodes 26) in the key projection area 18 (e.g. the key projection area 18a/18b/18c in FIG. 2B) or the electrode matrix M (e.g. the electrode matrix Ma/Mb/Mc in FIG. 2B) in the lengthwise direction L. NW represents the rows of electrodes covered by the key center distance PW in the widthwise direction W (for the first electrodes 24, NW is equivalent to the quantity of the series of first electrodes 20 covered in the widthwise direction W; for the second electrodes 26, NW is equivalent to the quantity of the second electrodes 26 of the series of second electrodes 22 covered in the widthwise direction W). NL represents the columns of electrodes covered by the key center distance PL in the lengthwise direction L (for the first electrodes 24, NL is equivalent to the quantity of the first electrodes 24 of the series of first electrodes 20 covered in the lengthwise direction L; for the second electrodes 26, NL is equivalent to the quantity of the series of second electrodes 22 covered in the lengthwise direction L). SW represents the dimension SW of the first electrode 24 or the second electrode 26 in the widthwise direction W. SL represents the dimension SL of the first electrode 24 or the second electrode 26 in the lengthwise direction L.

The dimensions (NW,NL) of the electrode matrix are the line-row amounts of the electrodes covered by the key center distances (PW, PL) according to the above formulas. Because the matrices M/Ma/Mb/Mc are arranged continuously by a certain electrode gap between any two adjacent matrices, and the electrode gaps of the whole keyboard touch electrode module 14 are usually similar or the same, the line-row amounts (NW,NL) are also equivalent to the line-row amounts of electrodes covered by single key projection area 18/18a/18b/18c or electrode matrix M/Ma/Mb/Mc in the widthwise direction W and the lengthwise direction L (i.e. by single side) respectively (i.e., equivalent to the rows and columns of electrodes at single side of single key projection area 18/18a/18b/18c or electrode matrix M/Ma/Mb/Mc). For the electrode matrices Ma/Mb/Mc in FIG. 2B, both of the line-row amounts (NW,NL) of the electrode matrix/Ma/Mb/Mc are 4; that is, the line-row amount of electrodes covered by the key center distance PW/PL is 4.

On the other hand, the aforementioned formulas for representing the dimensions and arrangement of the first electrode 24 (or second electrode 26) can also be expressed as:

$$w=[P-(D*N)]/N;$$

Therein, P represents the key center distance (key pitch) (i.e. a component PW or PL of the distance from center to center with respect to the widthwise direction W or the lengthwise direction L) of two adjacent key projection areas 18 (or the two electrode matrices Ma/Mb in FIG. 2B) in the widthwise direction W or the lengthwise direction L. D represents the electrode gap DW or DL of two adjacent electrodes (two first electrodes 24/second electrodes 26, or one first electrode 24 and one second electrode 26) in the key projection area 18/electrode matrix Ma/Mb in the widthwise direction W or the lengthwise direction L. N represents the line-row amount NW or NL of the electrodes covered by the key center distance P in the widthwise direction W or the lengthwise direction L. w represents the side length of the first electrode 24 in the widthwise direction W. In other words, the side length w is equal to the key center distance P minus the multiplier of the line-row amount N and the electrode gap D, and then divided by the line-row amount N.

It is noticed that the line-row amount N of the electrodes is the line-row amount of the electrodes covered by the key distance P according to the original meaning of the formula. Because two adjacent electrode matrices M/Ma/Mb are arranged continuously by a certain electrode gap between any two adjacent matrices, and the electrode gaps of the whole keyboard touch electrode module 14 are usually similar or the same, the line-row amount N is equivalent to the line-row amount of the electrodes covered by single key projection area 18 or electrode matrix Ma/Mb in the widthwise direction W (i.e. by single side) (i.e., equivalent to the rows and columns of electrodes at single side of single key projection area 18 or electrode matrix Ma/Mb). For the electrode matrix Ma/Mb in FIG. 2A, the line-row amount of the electrode matrix Ma/Mb is 4, equal to four line-rows of electrodes covered by the key center distance P.

For the embodiments in the foregoing and following, they are based on the premise that the electrode gaps are fixed (i.e. the gap between two first electrodes 24/second electrodes 26, and the gap between one first electrodes 24 and one second electrodes 26 are the same in the same direction) and the electrode dimensions are fixed (i.e. the first electrode 24 and the second electrode 26 have the same dimensions). For the application of the formula of the widthwise direction W, the dimension of any electrode in the widthwise direction W is a function of the key center distance PW and electrode gap DW of the key projection area 18 and the line-row amount NW of the electrodes in the electrode matrix Ma/Mb (or covered by the key center distance PW). Similarly, the above formula can also be used in the lengthwise direction L. That is, the dimension of any electrode in the lengthwise direction L is a function of the key center distance PL and electrode gap DL of the key projection area 18 and the line-row amount NL of the electrodes in the electrode matrix Ma/Mb (or covered by the key center distance PL). In summary, for the first electrode 24/second electrode 26 of the same shape (e.g. rectangle/diamond) and dimensions (e.g. side lengths of a rectangle or diagonal lengths of a rhombus), the dimensions of the first electrode 24/second electrode 26 in the widthwise direction W/lengthwise direction L can be inferred according to the above formula.

As shown by FIG. 1A and FIG. 1B, the touch keyboard 10 also includes the virtual touch area 120 on which the object O, such a finger of a user or a stylus, perform touch operation (or non-press movement). The touch area 120 covers at least the top side surfaces of all the square keys of the key structures 12 and the area covered by the plurality of key-gap layouts 125. Each key-gap layout 125 surrounds one corresponding key structure 12. Please refer to FIG. 2A to 2E together, on the keyboard touch electrode module 14, the touch area 120 corresponds to the touch area projection 140. The touch area projection 140 covers at least the key projection areas 18/18a/18b/18c corresponding to all the square keys of the key structures 12 and the key-gap layout projections 143/143a/143b. The touch area projection 140 can be regarded as the projection area of the touch area 120 in the vertical direction. The area covered by the touch area projection 140 may be partially or completely, larger than, smaller than or equal to the boundary of the key projection areas 18/18a/18b/18c corresponding to the square keys of the key structures 12. The profile of the touch area projection 140 may be a complete rectangle or an irregular boundary. Each key-gap layout projection 143/143a/143b surrounds one corresponding key projection area 18/18a/18b/18c. At least two adjacent key structures 12 (square keys) within the touch area 120 that are mis-aligned in the widthwise direction W correspond to two same electrode matrices Ma/Mb in FIG. 2B to 2E respectively.

In the embodiments of the invention, the linear connection of the electrodes means that two electrodes are connected to each other in a longitudinal or transverse relative position. The center connection line of the two electrodes in a linear connection is straight and is parallel to the longitudinal widthwise direction W or the transverse lengthwise direction L. In FIG. 2B to 2E, the electrode matrix Ma includes four serial segments of first electrodes 20a/20b/20c/20d (each of which is a portion of one series of first electrodes 20) and four serial segments of second electrodes 22a/22b/22c/22d (each of which is a portion of one series of second electrodes 22). The serial segments of first electrodes 20a/20b/20c/20d and the serial segments of second electrodes 22a/22b/22c/22d interlace with each other. The electrode matrix Mb includes four serial segments of first electrodes 20e/20f/20g/20h (each of which is a portion of one series of first electrodes 20) and four serial segments of second electrodes 22e/22f/22g/22h (each of which is a portion of one series of second electrodes 22). The serial segments of first electrodes 20e/20f/20g/20h and the serial segments of second electrodes 22e/22f/22g/22h interlace with each other.

In addition, in the first embodiment, the first electrodes 24 and the second electrodes 26 are diamond-shaped, which can increase the area utilization of the electrode distribution and can also increase the degree of interlacing between the first electrodes 24 and the second electrodes 26, both of which help to improve the sensing accuracy of the touch position. Furthermore, in the first embodiment, one electrode matrix M corresponds to four series of second electrodes 22 and four series of first electrodes 20, which is marked as a 4*4 arrangement for the convenience of description. In practice, the electrode matrix may be a 4*3 arrangement (i.e. corresponds to four series of second electrodes 22 and three series of first electrodes 20), a 4*5 arrangement, a 4*6 arrangement, a 8*3 arrangement, a 8*4 arrangement, a 8*5 arrangement, a 8*6 arrangement, and so on, which all can keep the electrodes of the electrode matrices aligned in the lengthwise direction L and the widthwise direction W.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A keyboard touch electrode module, disposed under a plurality of keycaps, the keyboard touch electrode module comprising:
   an electrode-carrying structure with a continuous sheet body;
   a plurality of series of first electrodes, formed on the electrode-carrying structure and continuously extending parallel to a lengthwise direction and arranged in parallel and spaced apart in a widthwise direction; and
   a plurality of series of second electrodes, formed on the electrode-carrying structure and continuously extending parallel to the widthwise direction and arranged in parallel and spaced apart in the lengthwise direction; and
   a control module, electrically connected to the plurality of series of first electrodes and the plurality of series of second electrodes;
   wherein the plurality of series of first electrodes and the plurality of series of second electrodes interlacing with each other to form a plurality of electrode matrices, the electrode matrices are identical to each other and are arranged continuously, the electrode matrices are in one-to-one correspondence with the keycaps, and the electrode matrices are arranged in the lengthwise direction and the widthwise direction;
   wherein two of the electrode matrices that are adjacent in the widthwise direction are mis-aligned in the widthwise direction and respectively correspond to two of the keycaps that are configured mis-aligned and adjacent to each other in the widthwise direction, and at least one of the plurality of series of first electrodes extends between projections of the two keycaps on the electrode-carrying structure;
   wherein the keycaps are located at a height above the electrode-carrying structure, and the control module generates a touch signal upon a non-press movement of an object that moves across two of the keycaps and a gap there-between above the corresponding plurality of series of first electrodes and the corresponding plurality of series of second electrodes thereunder.

2. The keyboard touch electrode module according to claim 1, wherein a projection of the keycap on the electrode-carrying structure is defined as a key projection area, a key-gap layout projection on the electrode-carrying structure is defined for each key projection area, the key-gap layout projection surrounds the corresponding key projection area and is located between the corresponding key projection area and the key projection areas that are adjacent to the corresponding key projection area, each key-gap layout projection covers a key-gap electrode pattern, and the key-gap electrode patterns are identical to each other.

3. The keyboard touch electrode module according to claim 1, wherein the electrode-carrying structure comprises a first substrate, a second substrate disposed opposite to the first substrate, and a spacer layer sandwiched between the first substrate and the second substrate, the plurality of series of first electrodes are formed on a first inner side surface of the first substrate, and the plurality of series of second electrodes are formed on a second inner side surface of the second substrate.

4. The keyboard touch electrode module according to claim 3, further comprising first and second trigger conductive portions, wherein a projection of the keycap on the electrode-carrying structure is defined as a key projection area, the first and second trigger conductive portions are located within one of the key projection areas and formed by extending from one series of first electrodes and one series of second electrodes respectively, the spacer layer has an opening, the first and second trigger conductive portions are disposed oppositely and separately corresponding to the opening, and a portion of the keyboard touch electrode module corresponding to the first and second trigger conductive portions is operable to be pressed to make the first and second trigger conductive portions approach each other through the opening.

5. The keyboard touch electrode module according to claim 4, wherein one of the first and second trigger conductive portions comprises a contact surface, the other of first and second trigger conductive portions comprises at least one contact line, and the first and second trigger conductive portions touch each other by the contact surface touching the at least one contact line.

6. The keyboard touch electrode module according to claim 4, wherein each of the first and second trigger conductive portions comprises at least one contact line, and the first and second trigger conductive portions touch each other by the contact lines touching each other.

7. The keyboard touch electrode module according to claim 6, wherein the contact line is one selected from the group of a straight line, a curve, a ring, a rectangle, a zigzag, and any combination thereof.

8. The keyboard touch electrode module according to claim 1, further comprising first and second trigger conductive portions and a conductive connection portion, wherein a projection of the keycap on the electrode-carrying structure is defined as a key projection area, the electrode-carrying structure comprises a first substrate, a second substrate disposed opposite to the first substrate, and a spacer layer sandwiched between the first substrate and the second substrate, the spacer layer has an opening, the plurality of series of first electrodes and the plurality of series of second electrodes are formed a first inner side surface of the first substrate, the conductive connection portion is formed on a second inner side surface of the second substrate corresponding to the opening, the first trigger conductive portion is formed by extending from one series of first electrodes or formed by one first electrode of the series of first electrodes, the second trigger conductive portion is formed by extending from one series of second electrodes or formed by one second electrode of the series of second electrodes, the first and second trigger conductive portions are located within one of the key projection areas, the conductive connection portion is disposed opposite to and separated from the first and second trigger conductive portions corresponding to the opening, and a portion of the keyboard touch electrode module corresponding to the first and second trigger conductive portions is operable to be pressed to make the conductive connection portion approach the first and second trigger conductive portions at the same time through the opening.

9. The keyboard touch electrode module according to claim 1, further comprising first and second trigger conductive portions and a conductive connection portion, wherein a projection of the keycap on the electrode-carrying structure is defined as a key projection area, the electrode-carrying structure comprises a first substrate, a second substrate disposed opposite to the first substrate, and a spacer layer sandwiched between the first substrate and the second substrate, the spacer layer has an opening, the plurality of series of first electrodes are formed on one of a first inner side surface of the first substrate and a first outer side surface of the first substrate, the plurality of series of second electrodes are formed on the other of the first inner side surface and the first outer side surface and are located within one of the key projection areas, the first and second trigger conductive portions are separately arranged on a second inner side surface of the second substrate, the conductive connection portion is formed by extending from one electrode of the series of first or second electrodes formed on the first inner side surface or formed by one electrode of the series of first or second electrodes formed on the first inner side surface, the conductive connection portion is disposed opposite to and separated from the first and second trigger conductive portions corresponding to the opening, and a portion of the keyboard touch electrode module corresponding to the first and second trigger conductive portions is operable to be pressed to make the conductive connection portion approach the first and second trigger conductive portions at the same time through the opening.

10. The keyboard touch electrode module according to claim 1, further comprising a membrane circuit board, wherein a projection of the keycap on the electrode-carrying structure is defined as a key projection area, the electrode-carrying structure is stacked on the membrane circuit board, and the membrane circuit board has a key switch for each key projection area.

11. The keyboard touch electrode module according to claim 1, further comprising first and second trigger conductive portions, wherein the electrode-carrying structure comprises a first substrate, a second substrate disposed opposite to the first substrate, and a spacer layer sandwiched between the first substrate and the second substrate, the plurality of series of first electrodes and the plurality of series of second electrodes are formed a first outer side surface of the first substrate, the spacer layer has an opening, the first and second trigger conductive portions are disposed oppositely and separately corresponding to the opening on a first inner side surface of the first substrate and a second inner side surface of the second substrate respectively, and a portion of the keyboard touch electrode module corresponding to the first and second trigger conductive portions is operable to be pressed to make the first and second trigger conductive portions approach each other through the opening.

12. The keyboard touch electrode module according to claim 1, wherein the keyboard touch electrode module has a plurality of through holes which pass through the electrode-carrying structure, the first electrodes, and the second electrodes, the plurality of through holes form a through-hole layout corresponding to each keycap, and the through-hole layouts are identical to each other.

13. The keyboard touch electrode module according to claim 1, wherein the keyboard touch electrode module has a plurality of through holes which pass through the electrode-carrying structure, the first electrodes, and the second electrodes, the plurality of through holes form a through-hole layout corresponding to each of at least two of the electrode matrices mis-aligned in the widthwise direction, and the through-hole layouts are identical to each other.

14. A keyboard touch electrode module, disposed under a plurality of keycaps, the keyboard touch electrode module comprising:
an electrode-carrying structure with a continuous sheet body;
a plurality of electrode matrices, formed on the electrode-carrying structure and continuously arranged in a lengthwise direction and a widthwise direction, the electrode matrices being directly connected with each other and being in one-to-one correspondence with the keycaps, two of the electrode matrices that are adjacent in the widthwise direction being shifted away from each other in the lengthwise direction and being mis-aligned in the widthwise direction, at least two of the electrode matrices that are mis-aligned in the widthwise direction being identical to each other, each electrode matrix comprising a plurality of serial segments of first electrodes and a plurality of serial segments of second electrodes, the plurality of serial segments of first electrodes and the plurality of serial segments of second electrodes interlacing with each other; and
a control module, electrically connected to the electrode matrices;
wherein the keycaps are located at a height above the electrode-carrying structure, and the control module generates a touch signal upon a non-press movement of an object that moves across two of the keycaps and a gap therebetween above the corresponding electrode matrices.

15. The keyboard touch electrode module according to claim 14, wherein each of at least two of the electrode matrices that are mis-aligned in the widthwise direction have a through-hole layout, the through-hole layout are identical to each other, and the through-hole layout comprises at least one through hole located within the electrode matrix.

16. The keyboard touch electrode module according to claim 14, wherein a projection of the keycap on the electrode-carrying structure is defined as a key projection area, a key-gap layout projection is defined for each key projection area, the key-gap layout projection surrounds the corresponding key projection area, and at least two of the key-gap layout projections that are mis-aligned in the widthwise direction cover the same area on the electrode-carrying structure.

17. The keyboard touch electrode module according to claim 14, wherein a projection of the keycap on the electrode-carrying structure is defined as a key projection area, each key projection area covers a key-face electrode pattern, and at least two of the key-face electrode patterns that are mis-aligned in the widthwise direction are identical to each other.

18. The keyboard touch electrode module according to claim 14, wherein a projection of the keycap on the electrode-carrying structure is defined as a key projection area, a key-gap layout projection is defined for each key projection area, the key-gap layout projection surrounds the corresponding key projection area, each key-gap layout projection covers a key-gap electrode pattern, and at least two of the key-gap electrode patterns that are mis-aligned in the widthwise direction are identical to each other.

19. A touch keyboard, comprising:
a base plate;
a plurality of keycaps, disposed above the base plate;
a keyboard touch electrode module, disposed between the base plate and the keycaps; and
a plurality of supporting structures, correspondingly connected to and between the base plate and the keycaps so that the keycap moves up and down relative to the base plate and the keyboard touch electrode module through the corresponding supporting structure;
wherein the keyboard touch electrode module comprises:
an electrode-carrying structure with a continuous sheet body, the keycaps being located at a height above the electrode-carrying structure;
a plurality of series of first electrodes, formed on the electrode-carrying structure;
a plurality of series of second electrodes, formed on the electrode-carrying structure, the plurality of series of first electrodes and the plurality of series of second electrodes interlacing with each other to form a plurality of electrode matrices, the electrode matrices being arranged in a lengthwise direction and a widthwise direction, each electrode matrix corresponding to a key projection area of one of the keycaps on the electrode-carrying structure, two of the electrode matrices that are adjacent in the width direction being shifted away from each other in the lengthwise direction and being mis-aligned in the widthwise direction, two of the key projection areas that are adjacent in the width direction being shifted away from each other in the lengthwise direction and being mis-aligned in the widthwise direction, at least two of the electrode matrices that are mis-aligned in the widthwise direction being identical to each other; and
a control module, electrically connected to the plurality of series of first electrodes and the plurality of series of second electrodes, the control module generates a touch signal upon a non-press movement of an object that moves across two of the keycaps and a gap therebetween above the corresponding plurality of series of first electrodes and the corresponding plurality of series of second electrodes thereunder.

\* \* \* \* \*